United States Patent
Otake

(10) Patent No.: US 7,906,811 B2
(45) Date of Patent: *Mar. 15, 2011

(54) SEMICONDUCTOR DEVICE WITH PROTECTION ELEMENT DISPOSED AROUND A FORMATION REGION OF A TRANSISTOR

(75) Inventor: Seiji Otake, Saitama (JP)

(73) Assignee: Sanyo Electric Co., Ltd. (Osaka), Osaka (JP)

( * ) Notice: Subject to any disclaimer, the term of this patent is extended or adjusted under 35 U.S.C. 154(b) by 704 days.

This patent is subject to a terminal disclaimer.

(21) Appl. No.: 11/738,621

(22) Filed: Apr. 23, 2007

(65) Prior Publication Data

US 2007/0246738 A1    Oct. 25, 2007

(30) Foreign Application Priority Data

Apr. 24, 2006  (JP) .................................. 2006-119652

(51) Int. Cl.
*H01L 23/62* (2006.01)
(52) U.S. Cl. ....................................... 257/355; 257/139
(58) Field of Classification Search .................. 257/139, 257/355
See application file for complete search history.

(56) References Cited

U.S. PATENT DOCUMENTS

| 5,756,387 | A  | * | 5/1998  | Villa et al. ..................... 438/328 |
| 5,910,664 | A  | * | 6/1999  | Ajit .................................. 257/212 |
| 6,034,413 | A  |   | 3/2000  | Hastings et al. |
| 6,466,423 | B1 |   | 10/2002 | Yu |
| 6,949,424 | B2 |   | 9/2005  | Springer |
| 7,202,531 | B2 | * | 4/2007  | Imahashi et al. ............. 257/355 |
| 2001/0010954 | A1 | * | 8/2001  | Lin et al. ....................... 438/200 |
| 2002/0045301 | A1 | * | 4/2002  | Sicard et al. ................... 438/197 |
| 2003/0230781 | A1 |   | 12/2003 | Makita et al. |
| 2006/0118814 | A1 |   | 6/2006  | Cai et al. |
| 2006/0220099 | A1 | * | 10/2006 | Kikuchi et al. ............... 257/315 |
| 2006/0223258 | A1 | * | 10/2006 | Okushima ..................... 438/202 |
| 2008/0224220 | A1 |   | 9/2008  | Blanc et al. |

FOREIGN PATENT DOCUMENTS

| JP | 07-015010     | 1/1995 |
| JP | 08-148652     | 6/1996 |
| JP | 2001-168206   | 6/2001 |
| JP | 2002-198541   | 7/2002 |
| JP | 2002-313947   | 10/2002 |
| JP | 2003-188381   | 7/2003 |
| KR | 1996-12553    | 4/1996 |
| KR | 10-0200538    | 5/1996 |
| KR | 2002-0052954  | 7/2002 |

OTHER PUBLICATIONS

Otake, list of claims, Semiconductor Device and Method of Manufacturing the Same, U.S. Appl. No. 11/738,722, filed Apr. 23, 2007.
Kim, S., "A Study on the Ruggedness of the Insulated Gate Bipolar Transistor," Doctoral Dissertation, Seoul National University, Feb. 2005, 15 pages.

* cited by examiner

*Primary Examiner* — Thao X Le
*Assistant Examiner* — Geoffrey Ida
(74) *Attorney, Agent, or Firm* — Fish & Richardson P.C.

(57) ABSTRACT

In a semiconductor device of the present invention, an N type epitaxial layer is divided into a plurality of element formation regions by an isolation region. In one of the element formation regions, a MOS transistor is formed. Around the MOS transistor, a protection element having a PN junction region is formed. The PN junction region has a junction breakdown voltage lower than that of a PN junction region of the MOS transistor. By use of this structure, when negative ESD surge is applied to a pad for a source electrode, the PN junction region of the protection element breaks down. Accordingly, the MOS transistor can be protected.

8 Claims, 18 Drawing Sheets

SEMICONDUCTOR DEVICE WITH PROTECTION ELEMENT DISPOSED AROUND A FORMATION REGION OF A TRANSISTOR

Priority is claimed to Japanese Patent Application Number JP2006-119652 filed on Apr. 24, 2006, the disclosure of which is incorporated herein by reference in its entirety.

BACKGROUND OF THE INVENTION

1. Field of the Invention

The present invention relates to a semiconductor device in which ESD (Electro-Static Discharge) resistance is improved, and a method of manufacturing the same.

2. Description of the Related Art

As an example of conventional semiconductor devices, the following device using surge protection elements has been known. For example, a total of four surge protection elements are disposed respectively near four sides of a rectangular or substantially rectangular pad, one on each side. The pad is connected with one of electrodes of each of the surge protection elements by wiring. A wire for distributing a surge current is connected with the other one of the electrodes of each of the surge protection elements by wiring. Note that a potential of the pad is supplied to an internal circuit through the wiring. Moreover, each of the surge protection elements is, for example, a Zener diode, a PMOS diode or an NMOS diode. By use of this structure, the surge current applied to the pad is dispersed to all of the surge protection elements disposed around the pad. Accordingly, a surge breakdown resistance of a semiconductor device is improved. This technique is described for instance in Japanese Patent Application Publication No. 2002-313947.

As another example of conventional semiconductor devices, the following insulated gate bipolar transistor including surge protection elements has been known. For example, an N type epitaxial layer used as a drift layer is formed on a P type semiconductor substrate used as a collector layer. In an N type epitaxial layer used as an internal cell part, P type diffusion layers used as channel regions are formed. Moreover, in each of the P type diffusion layers, N type diffusion layers used as emitter regions are formed. Furthermore, in an N type epitaxial layer used as an electrode pad or a field plate part, a P type diffusion layer having the same shape as that of the P type diffusion layer used as the channel region is formed. By use of this structure, when ESD surge is applied to a collector electrode, avalanche breakdown occurs evenly in the entirety of a chip. Accordingly, current concentration in a certain region is prevented. As a result, surge resistance of the entirety of the chip to ESD is improved. This technique is described for instance in Japanese Patent Application Publication No. 2003-188381.

As described above, a structure for the conventional semiconductor device has been known, in which a plurality of surge protection elements are disposed around a pad, and in which a surge current applied to the pad is dispersed to all of the surge protection elements. By using this structure, the surge current is prevented from flowing into an internal circuit, and is thereby prevented from breaking down the internal circuit. However, the following problem may occur depending on the magnitude of the surge current and the like. Specifically, a problem of breakdown of an internal circuit may occur, when the surge current is too large, for example. This is because the surge protection elements around the pad cannot cope with such a large surge current into the internal circuit.

Moreover, as described above, a structure for the conventional semiconductor device has been known, in which avalanche breakdown occurs evenly in the entirety of a chip when ESD surge is applied to a collector electrode. In this structure, the avalanche breakdown also occurs in an internal cell when the ESD surge is applied. Accordingly, depending on the magnitude of the applied ESD surge, a problem may occur that the internal cell is broken down.

SUMMARY OF THE INVENTION

The present invention was made in consideration of the foregoing circumstances. A semiconductor device of the present invention includes a semiconductor layer, a MOS transistor formed in the semiconductor layer, a first junction region between a diffusion layer used as a back gate region of the MOS transistor and the semiconductor layer used as a drain region, and a protection element. The protection element is disposed around a formation region of the MOS transistor, and has a second junction region having a junction breakdown voltage lower than that of the first junction region. Accordingly, in the present invention, the second junction region of the protection element breaks down before the first junction region of the MOS transistor does. By use of this structure, the MOS transistor can be protected from an overvoltage.

Moreover, the semiconductor device of the present invention further includes an isolation region which divides the semiconductor layer. The MOS transistor is formed in one of regions divided by the isolation region. Moreover, the protection element is formed by utilizing the isolation region surrounding the formation region of the MOS transistor. Accordingly, in the present invention, the protection element is formed by utilizing the isolation region. By use of this structure, a current generated by the overvoltage is caused to flow into a substrate through the isolation region, and then dispersed.

Moreover, in the semiconductor device of the present invention, the semiconductor layer is formed by staking a semiconductor substrate of one conductivity type with at least one epitaxial layer of opposite conductivity type. In addition, the second junction region is formed of a first diffusion layer of the one conductivity type and a diffusion layer of the opposite conductivity type. The first diffusion layer of the one conductivity type is connected by wiring to the diffusion layer used as the back gate region. The diffusion layer of the opposite conductivity type is formed in the epitaxial layer. The diffusion layer of the opposite conductivity type is disposed so as to overlap a second diffusion layer of the one conductivity type connected to the semiconductor substrate. Accordingly, in the present invention, the current generated by the overvoltage is dispersed after flowing into the substrate through the diffusion layer of the one conductivity type connected to the substrate.

Moreover, the semiconductor device of the present invention further includes an isolation region which divides the semiconductor layer. The second diffusion layer of the one conductivity type is a diffusion layer included in the isolation regions. Accordingly, in the present invention, the current generated by the overvoltage is dispersed into the substrate through the isolation region. Moreover, by utilizing the isolation region, a dedicated protection element can be formed for each semiconductor element.

Moreover, in the semiconductor device of the present invention, the first diffusion layer of the one conductivity type and the diffusion layer of the opposite conductivity type are circularly disposed around the formation region of the MOS transistor, and along a formation region of the isolation region. Accordingly, in the present invention, by utilizing the isolation region, it is possible to prevent concentration of the current, which is generated by the overvoltage, in the protection element.

Moreover, in the semiconductor device of the present invention, the protection element operates as a bipolar transistor. Accordingly, in the present invention, by operating the protection element used as the bipolar transistor, current capacity in the protection element can be improved.

A method of manufacturing a semiconductor device according to the present invention is a method of manufacturing a semiconductor device, in which at least one epitaxial layer of opposite conductivity type is formed on a semiconductor substrate of one conductivity type, in which an isolation region dividing the epitaxial layer into a plurality of element formation region is formed, and in which a MOS transistor is formed in one of the plurality of element formation regions. The method includes the steps of forming a first diffusion layer of the one conductivity type around a formation region of the MOS transistor, forming a diffusion layer of the opposite conductivity type which partially overlaps the first diffusion layer of the one conductivity type and a second diffusion layer of the one conductivity type included in the isolation regions, and connecting a diffusion layer used as a back gate region of the MOS transistor to the first diffusion layer of the one conductivity type by use of a wiring layer on the epitaxial layer. Accordingly, in the present invention, by forming a protection element around the formation region of the MOS transistor, the MOS transistor can be protected from an overvoltage.

Moreover, in the method of manufacturing a semiconductor device according to the present invention, the diffusion layer used as the back gate region of the MOS transistor and the first diffusion layer of the one conductivity type are formed in the same process. Accordingly, in the present invention, by forming the diffusion layer for the back gate and the diffusion layer for the protection element in the same process, manufacturing costs of a semiconductor device can be reduced.

DETAILED DESCRIPTION OF THE PREFERRED EMBODIMENTS

Figure 1:
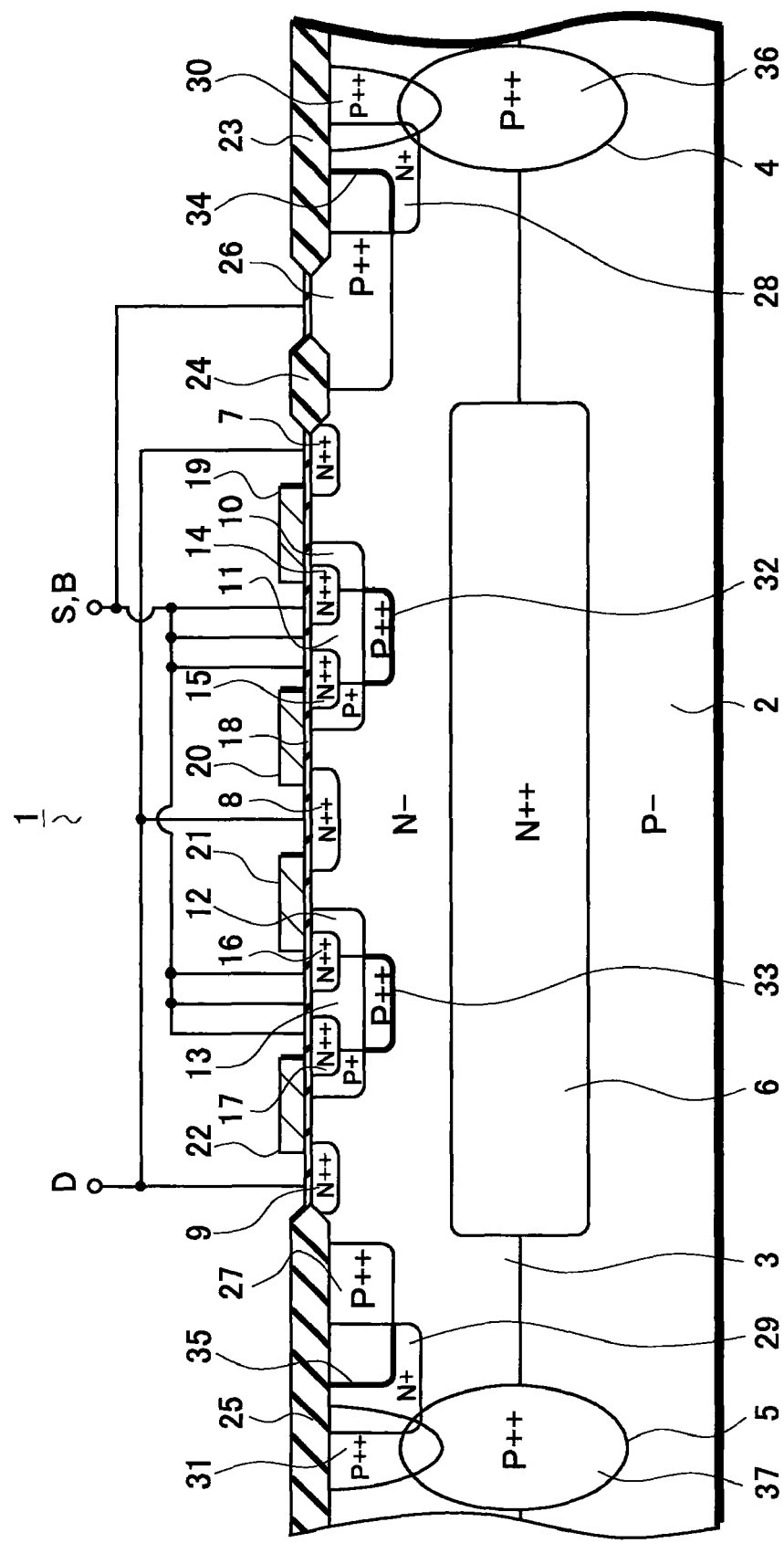
FIG. 1 is a cross-sectional view showing a semiconductor device according to a first embodiment of the present invention.
Figure 2:
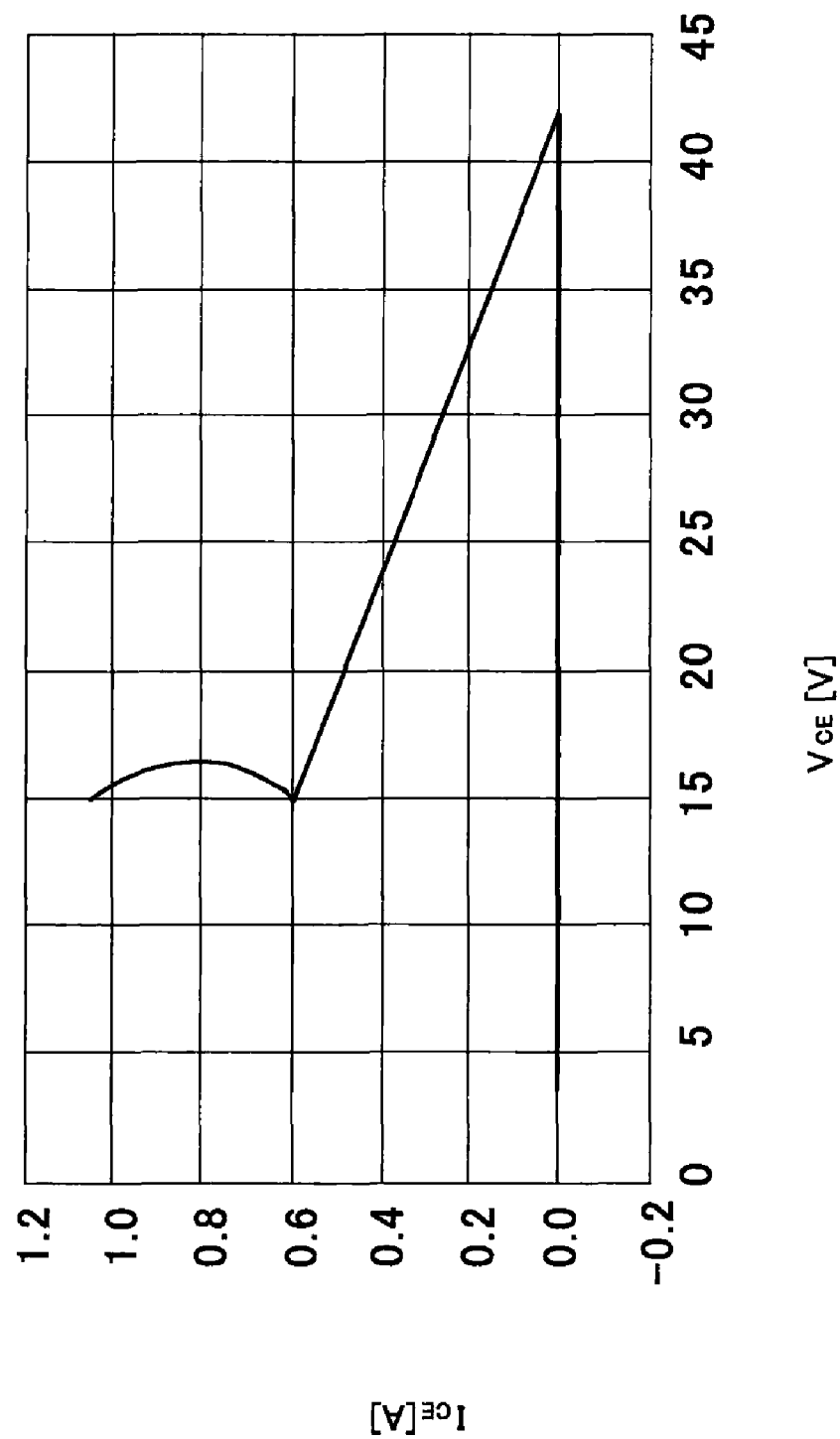
FIG. 2 is a graph showing characteristics of a protection element in the semiconductor device according to the first embodiment of the present invention.

With reference to FIGS. 1 and 2, a semiconductor device according to a first embodiment of the present invention will be described in detail below. FIG. 1 is a cross-sectional view for describing the semiconductor device according to this embodiment. FIG. 2 is a graph for describing characteristics of a protection element in this embodiment.

As shown in FIG. 1, an N-channel MOS transistor 1 mainly includes a P type single crystal silicon substrate 2, an N type epitaxial layer 3, isolation regions 4 and 5, an N type buried diffusion layer 6, N type diffusion layers 7 to 9 used as drain regions, P type diffusion layers 10 to 13 used as back gate regions, N type diffusion layers 14 to 17 used as source regions, a gate oxide film 18, and gate electrodes 19 to 22.

The N type epitaxial layer 3 is formed on the P type single crystal silicon substrate 2. Note that, although one epitaxial layer 3 is formed on the substrate 2 in this embodiment, the present invention is not limited to this case. For example, the substrate is stacked with a plurality of epitaxial layers.

Each of the isolation regions 4 and 5 is formed so as to extend in the substrate 2 and the epitaxial layer 3. The epitaxial layer 3 is divided into a plurality of element formation regions by the isolation regions 4 and 5. For example, each of the isolation regions 4 and 5 is formed circularly surrounding a region where the MOS transistor 1 is formed (hereinafter such a region is referred to as a formation region).

The N type buried diffusion layer 6 is formed so as to extend in the substrate 2 and the epitaxial layer 3. As shown in FIG. 1, the N type buried diffusion layer 6 is formed across the formation region of the MOS transistor 1 defined by the isolation regions 4 and 5.

The N type diffusion layers 7 to 9 are formed in the epitaxial layer 3. The N type diffusion layers 7 to 9 are used as the drain regions. Note that the N type diffusion layers 7 and 9 may be circularly formed around the N type diffusion layer 8.

The P type diffusion layers 10 to 13 are formed in the epitaxial layer 3. The P type diffusion layers 10 to 13 are used as the back gate regions. Note that the P type diffusion layers 10 and 12 may be circularly formed around the N type diffusion layer 8. Moreover, the P type diffusion layers 11 and 13 may be circularly formed around the N type diffusion layer 8.

The N type diffusion layers 14 and 15 are formed in the P type diffusion layer 10, and the N type diffusion layers 16 and 17 are formed in the P type diffusion layer 12. The N type diffusion layers 14 to 17 are used as the source regions. As shown in FIG. 1, the N type diffusion layers 14 and 15 are wired so as to have the same potential as that of the P type diffusion layers 10 and 11. Moreover, the N type diffusion layers 16 and 17 are wired so as to have the same potential as that of the P type diffusion layers 12 and 13. Note that the N type diffusion layers 14 and 17 may be formed circularly around the N type diffusion layer 8. Moreover, the N type diffusion layers 15 and 16 may be formed circularly around the N type diffusion layer 8.

The gate oxide film 18 is formed on the epitaxial layer 3.

The gate electrodes 19 to 22 are formed on the gate oxide film 18. Each of the gate electrodes 19 to 22 is formed of, for example, a polysilicon film, a tungsten silicide film or the like so as to have a desired thickness. The P type diffusion layers 10 positioned below the gate electrodes 19 and 20 and the P type diffusion layer 12 positioned below the gate electrodes 21 and 22 are used as channel regions. Note that the gate electrodes 19 and 22 may be circularly formed. Moreover, the gate electrodes 20 and 21 may be circularly formed.

LOCOS (Local Oxidation of Silicon) oxide films 23 to 25 are formed in the epitaxial layer 3. Each of the LOCOS oxide films 23 to 25 has a thickness of, for example, about 3000 to 10000 Å in its flat portion.

P type diffusion layers 26 and 27 are formed in the epitaxial layer 3. The P type diffusion layers 26 and 27 are disposed around the formation region of the MOS transistor 1 in the region defined by the isolation regions 4 and 5. Moreover, as shown in FIG. 1, the P type diffusion layers 26 and 27 are wired so as to have the same potential as a back gate potential of the MOS transistor 1. Note that the P type diffusion layers 26 and 27 may be circularly disposed around the formation region of the MOS transistor 1, and along an arrangement of the isolation regions 4 and 5.

N type diffusion layers 28 and 29 are formed in the epitaxial layer 3. The N type diffusion layers 28 and 29 are formed so as to at least partially overlap the P type diffusion layers 26 and 27, respectively. Furthermore, the N type diffusion layers 28 and 29 are formed so as to at least partially overlap P type diffusion layers 30 and 31 included in the isolation regions 4 and 5, respectively. The N type diffusion layers 28 and 29 are not connected directly to a wiring layer (not shown) on the epitaxial layer 3. However, a drain potential is substantially applied thereto through the epitaxial layer 3. Note that the N type diffusion layers 28 and 29 may be circularly disposed around the formation region of the MOS transistor 1, and along the arrangement of the isolation regions 4 and 5.

Next, as indicated by thick solid lines, a PN junction region 32 is formed between the P type diffusion layer 11 used as the back gate region of the MOS transistor 1 and the N type epitaxial layer 3 used as the drain region. Meanwhile, a PN junction region 33 is formed between the P type diffusion layer 13 used as the back gate region of the MOS transistor 1 and the N type epitaxial layer 3 used as the drain region. As described above, the back gate potential, which is the same as a source potential, is applied to the P type diffusion layers 11 and 13. Meanwhile, the drain potential is applied to the N type epitaxial layer 3 through the N type diffusion layers 7 to 9. That is, a reverse bias is applied to the PN junction regions 32 and 33 of the MOS transistor 1.

In addition, as indicated by thick solid lines, a PN junction region 34 is formed between the P type diffusion layer 26 and the N type diffusion layer 28 around the formation region of the MOS transistor 1. Moreover, a PN junction region 35 is formed between the P type diffusion layer 27 and the N type diffusion layer 29. That is, the PN junction regions 34 and 35 are formed around the formation region of the MOS transistor 1. As described above, the same potential as the back gate potential is applied to the P type diffusion layers 26 and 27 through the wiring layer on the epitaxial layer 3. Meanwhile, the drain potential is substantially applied to the N type diffusion layers 28 and 29 through the epitaxial layer 3. That is, substantially the same reverse bias as that applied to the PN junction regions 32 and 33 is applied to the PN junction regions 34 and 35.

Here, the PN junction regions 34 and 35 are formed so as to have a junction breakdown voltage lower than that of the PN junction regions 32 and 33. To be specific, for example, suppose a structure in which the P type diffusion layers 11, 13, 26 and 27 are formed in the same process so as to have the same impurity concentration. In this case, formation of the N type diffusion layers 28 and 29 in the N type epitaxial layer 3 increases the impurity concentration on the N type region side in the PN junction regions 34 and 35. That is, by controlling the impurity concentration of the N type diffusion layers 28 and 29, the junction breakdown voltage of the PN junction regions 34 and 35 is caused to be lower than that of the PN junction regions 32 and 33. Moreover, suppose a structure in which the P type diffusion layers 1 and 13 and the P type diffusion layers 26 and 27 are formed in different processes. In this case, the junction breakdown voltage of the PN junction regions 34 and 35 similarly is caused to be lower than that of the PN junction regions 32 and 33 by controlling the impurity concentrations of the P type diffusion layers 11, 13, 26 and 27. Note that the PN junction regions 34 and 35 have the junction breakdown voltage that can resist a source-drain voltage applied when the MOS transistor 1 operates.

By use of the structure described above, for example, when an overvoltage, for example, negative ESD surge is applied to a pad for a source electrode in the MOS transistor 1, the PN junction regions 34 and 35 break down before the PN junction regions 32 and 33 break down. A breakdown current then flows through the PN junction regions 34 and 35 to prevent breakdown of the PN junction regions 32 and 33. Accordingly, the MOS transistor 1 can be protected from the ESD surge. Specifically, protection elements having the PN junction regions 34 and 35 are operated against the ESD surge. As a result, the MOS transistor 1 can be protected.

Furthermore, in the protection elements having the PN junction regions 34 and 35, the PN junction regions 34 and 35 are formed across a wide region by disposing the P type diffusion layers 26 and 27 and the N type diffusion layers 28 and 29, and along the arrangement of the isolation regions 4 and 5. This structure makes it possible to prevent concentration of the breakdown current in the PN junction regions 34 and 35. Accordingly, it is possible to suppress breakdown of the protection elements having the PN junction regions 34 and 35.

Furthermore, the protection elements having the PN junction regions 34 and 35 are formed by utilizing the isolation regions 4 and 5 within the element formation region defined by the isolation regions 4 and 5. By use of this structure, the junction breakdown voltage of the protection element can be determined according to each of semiconductor elements formed in the element formation region defined by the isolation regions. That is, protection elements suitable for the respective semiconductor elements can be individually disposed, and thus each of the semiconductor elements can be protected from the ESD surge and the like. For example, even when an ESD surge protection element is disposed around the pad for the source electrode, the semiconductor elements can be more surely protected by further forming the protection elements described above in the formation regions of the respective semiconductor elements. In addition, an actual operation region of a chip can be effectively utilized by using the isolation regions to include the protection elements in each of the element formation regions.

In FIG. 2, a horizontal axis shows a collector-emitter voltage ($V_{CE}$) of a PNP transistor, and a vertical axis shows a collector-emitter current ($I_{CE}$) of the PNP transistor. Note that FIG. 2 shows data on the PNP transistor in which the P type diffusion layers 26 and 27 (see FIG. 1) are set to be emitter regions, the N type diffusion layers 28 and 29 (see FIG. 1) are set to be base regions, and the P type diffusion layers 30, 31, 36 and 37 (see FIG. 1) are set to be collector regions.

As described above, the N type diffusion layers 28 and 29 having the PN junction regions 34 and 35 formed respectively therein are formed so as to also overlap the P type diffusion layers 30 and 31. The P type diffusion layers 30, 31, 36 and 37 are electrically connected to the substrate 2 in order to form the isolation regions 4 and 5. By use of this structure, the protection elements having the PN junction regions 34 and 35 operate as the PNP transistors including the P type diffusion layers 26 and 27, the N type diffusion layers 28 and 29, and the P type diffusion layers 30, 31, 36 and 37.

For example, suppose a case where negative ESD surge is applied to the pad for the source electrode in the MOS transistor 1. When the PN junction regions 34 and 35 break down, a current flows between the base and the emitter of the PNP transistor, and the PNP transistor is turned on. When the PNP transistor is turned on, a breakdown current flows into the substrate 2. That is, when each of the protection elements having the PN junction regions 34 and 35 operates as a bipolar transistor, the breakdown current flows into the substrate 2 and disperses therein.

In this event, as shown in FIG. 2, a reverse bias is applied between the collector and the emitter of the PNP transistor, and the PNP transistor is turned on when $V_{CE}$ becomes 42 (V), for example. Moreover, when the PNP transistor is turned on, the conductivity modulation is caused at the P type diffusion layers 30, 31, 36 and 37 used as the collector regions. Accordingly, a resistance value is significantly reduced, and current capacity is improved. Specifically, when each of the protection elements having the PN junction regions 34 and 35 operates as the bipolar transistor, capacity of the breakdown current flowing into the substrate 2 is improved.

Moreover, as shown in FIG. 1, when the breakdown current flows through the isolation regions 4 and 5, potentials of the substrate 2 and the isolation regions 4 and 5 are changed. However, by operating the protection element as the bipolar transistor, a range of potential changes in the substrate 2 and the isolation regions 4 and 5 can be decreased. Moreover, the potential change in the substrate 2 can prevent malfunction of semiconductor elements formed in other element formation regions.

Meanwhile, for example, when positive ESD surge is applied to the pad for the source electrode in the MOS transistor 1, a forward bias is applied to the PN junction regions 32 and 33 and the PN junction regions 34 and 35. In this case, as described above, the PN junction regions 34 and 35 become low resistance regions by the N type diffusion layers 28 and 29. Moreover, by disposing the P type diffusion layers 26 and 27 and the N type diffusion layers 28 and 29 in wide regions, and along the isolation regions 4 and 5, a current path width is increased. Accordingly, the PN junction regions 34 and 35 become much lower resistance regions. By use of this structure, a current generated by application of the positive ESD surge flows into the substrate 2 mainly through the PN junction regions 34 and 35. Also in this event, when each of the protection elements having the PN junction regions 34 and 35 operates as the bipolar transistor, capacity of the current flowing into the substrate 2 is improved. Moreover, the MOS transistor 1 is protected by preventing breakdown of the PN junction regions 32 and 33 due to concentration of the current generated by application of the positive ESD surge.

Next, with reference to FIGS. 4 to 11, detailed description will be given of a method of manufacturing a semiconductor device according to the first embodiment of the present invention. FIGS. 4 to 11 are cross-sectional views showing the method of manufacturing a semiconductor device according to this embodiment. Note that FIGS. 4 to 11 show a method of manufacturing the semiconductor device shown in FIG. 1.

Figure 4:
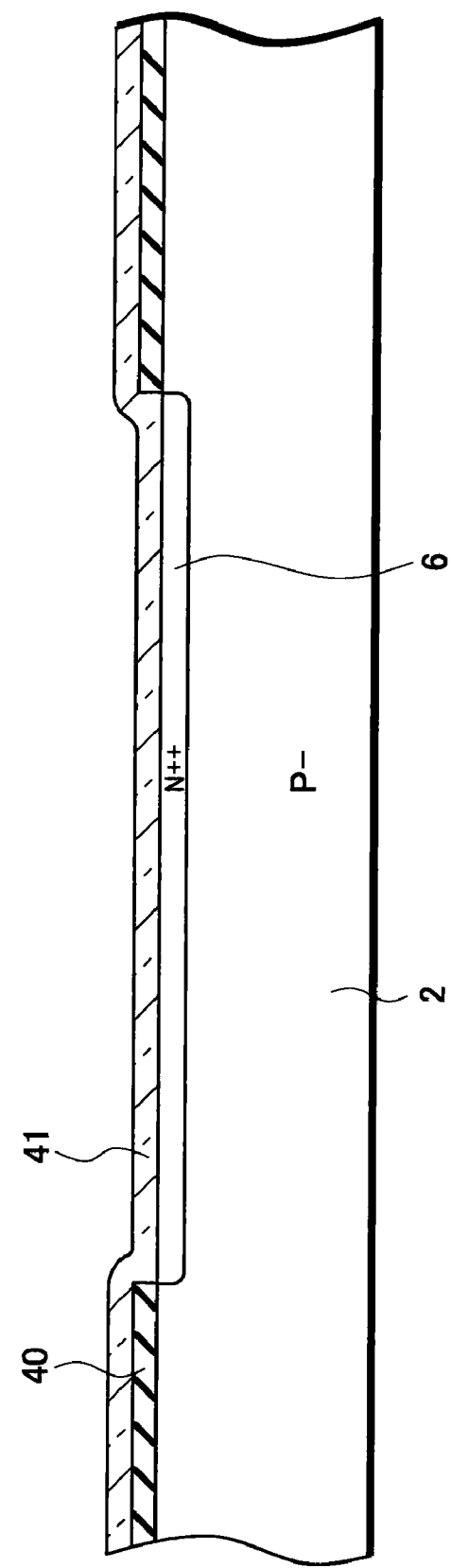
FIG. 4 is a first cross-sectional view showing a method of manufacturing a semiconductor device according to a first embodiment of the present invention.

First, as shown in FIG. 4, a P type single crystal silicon substrate 2 is prepared. A silicon oxide film 40 is formed on the substrate 2, and the silicon oxide film 40 is selectively removed so as to form an opening in a formation region of an N type buried diffusion layer 6. Thereafter, by using the silicon oxide film 40 as a mask, a liquid source 41 containing an N type impurity, for example, antimony (Sb) is applied onto a surface of the substrate 2 by use of a spin-coating method. Subsequently, after antimony (Sb) is thermally diffused to form the N type buried diffusion layer 6, the silicon oxide film 40 and the liquid source 41 are removed.

Figure 5:
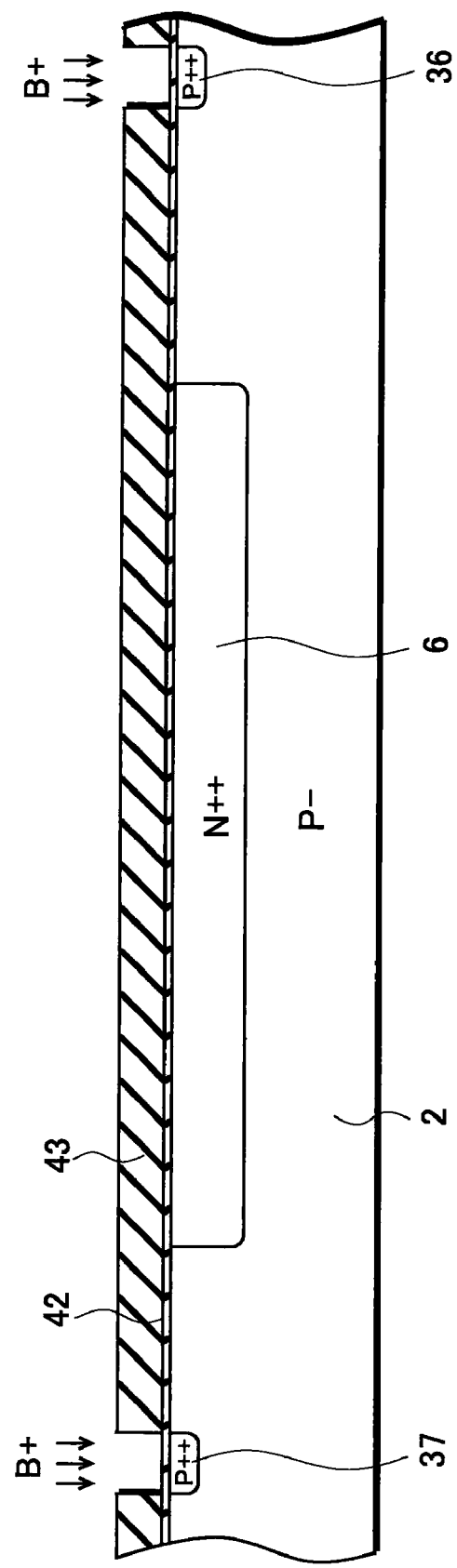
FIG. 5 is a second cross-sectional view showing the method of manufacturing a semiconductor device according to the first embodiment of the present invention.

Next, as shown in FIG. 5, a silicon oxide film 42 is formed on the substrate 2 and a photoresist 43 is formed on the silicon oxide film 42. Thereafter, by use of a heretofore known photolithography technique, openings are formed in the photoresist 43 on regions where P type buried diffusion layers 36 and 37 are to be respectively formed. Subsequently, ions of a P type impurity, for example, boron (B) are implanted from the surface of the substrate 2 at an accelerating voltage of 40 to 180 (keV) and a dose of $1.0\times10^{13}$ to $1.0\times10^{16}$ (/cm$^2$). After the photoresist 43 is removed and the P type buried diffusion layers 36 and 37 are formed by thermal diffusion, the silicon oxide film 42 is removed.

Figure 6:
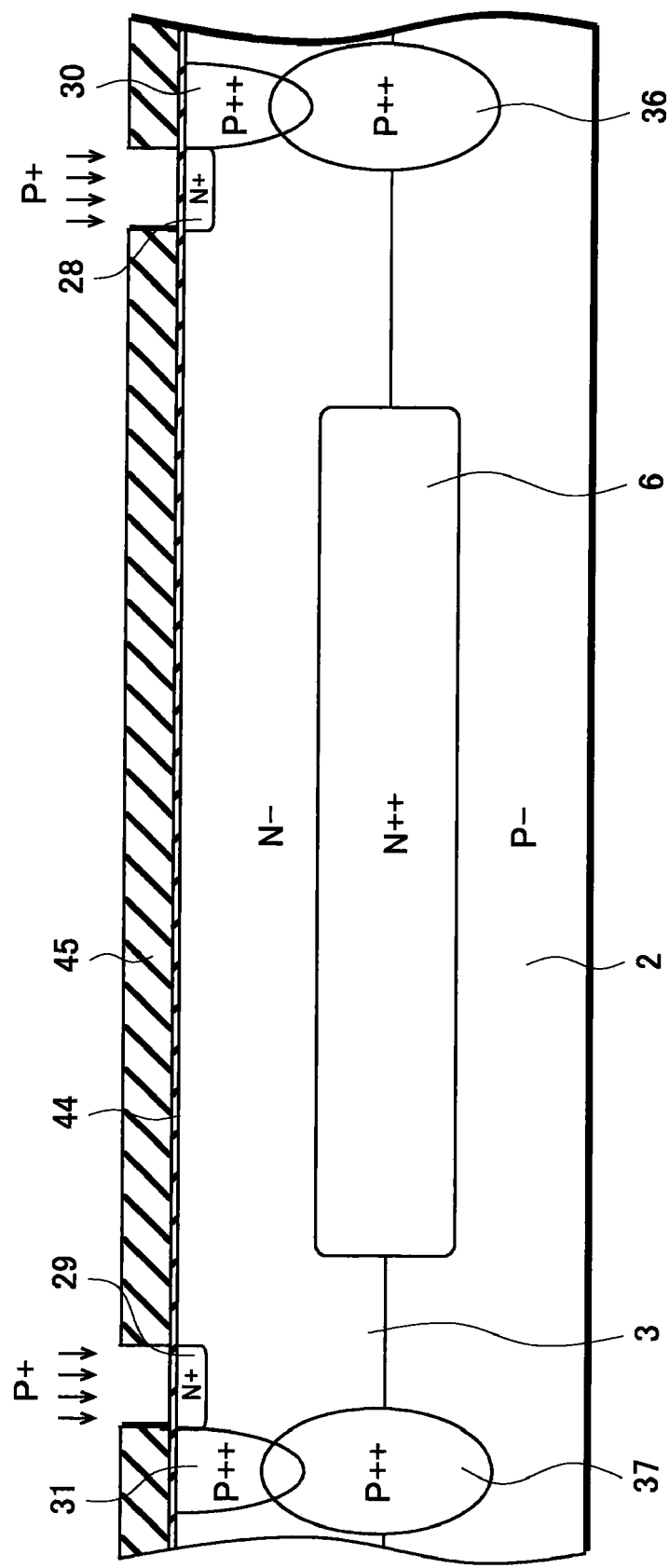
FIG. 6 is a third cross-sectional view showing the method of manufacturing a semiconductor device according to the first embodiment of the present invention.

Next, as shown in FIG. 6, the substrate 2 is placed on a susceptor of a vapor phase epitaxial growth apparatus, and an N type epitaxial layer 3 is formed on the substrate 2. The vapor phase epitaxial growth apparatus mainly includes a gas supply system, a reactor, an exhaust system and a control system. In this embodiment, by use of a vertical reactor, thickness uniformity of the epitaxial layer can be improved. The N type buried diffusion layer 6 and the P type buried diffusion layers 36 and 37 are thermally diffused by heat treatment in the step of forming the epitaxial layer 3.

Next, by use of the heretofore known photolithography technique, P type diffusion layers 30 and 31 are formed in the epitaxial layer 3. Thereafter, a silicon oxide film 44 is formed on the epitaxial layer 3, and a photoresist 45 is formed on the silicon oxide film 44. Subsequently, by use of the heretofore known photolithography technique, openings are formed in the photoresist 45 on regions where N type diffusion layers 28 and 29 are to be respectively formed. Thereafter, ions of an N type impurity, for example, phosphorus (P) are implanted from the surface of the epitaxial layer 3 at an accelerating voltage of 40 to 180 (keV) and a dose of $1.0 \times 10^{13}$ to $1.0 \times 10^{16}$ (/cm$^2$). Subsequently, the photoresist 45 is removed, and the N type diffusion layers 28 and 29 are formed by thermal diffusion. Note that an impurity concentration of the N type diffusion layers 28 and 29 is controlled so as to cause a junction breakdown voltage of PN junction regions 34 and 35 (see FIG. 1) to be lower than that of PN junction regions 32 and 33 (see FIG. 1).

Figure 7:
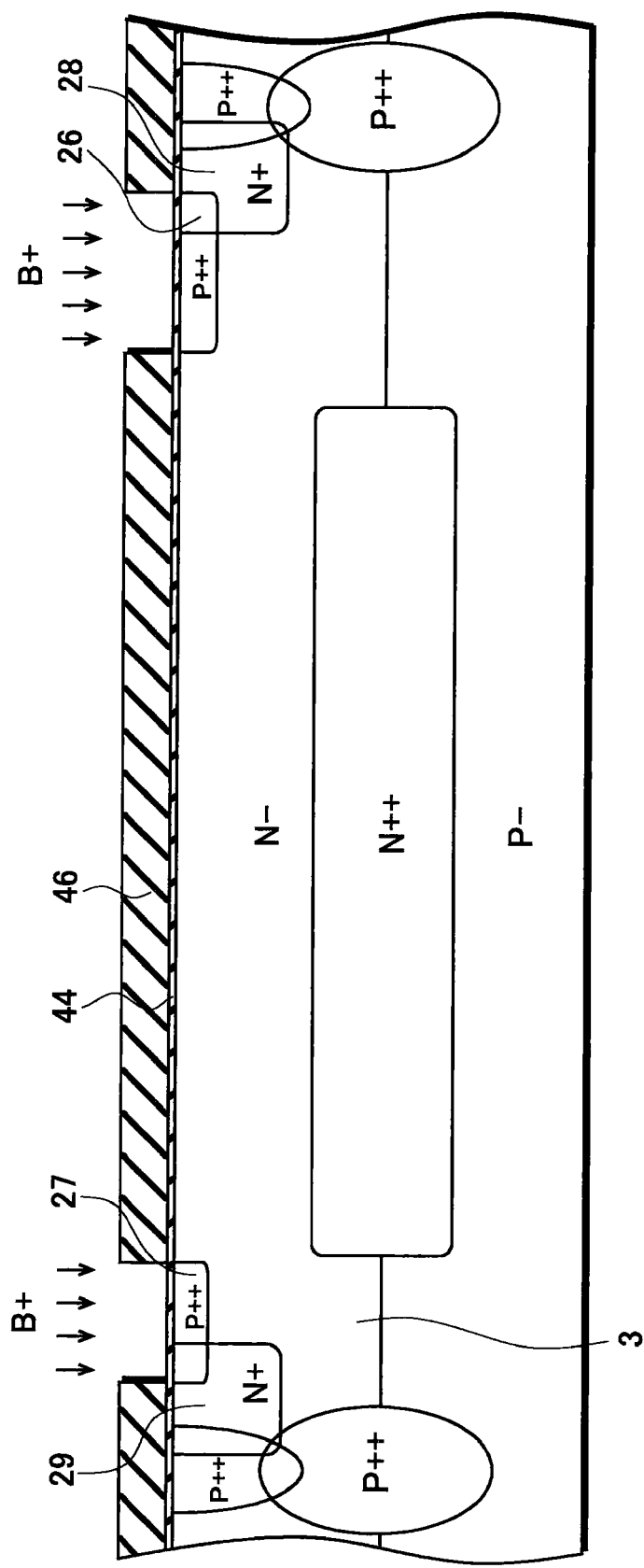
FIG. 7 is a fourth cross-sectional view showing the method of manufacturing a semiconductor device according to the first embodiment of the present invention.

Next, as shown in FIG. 7, a photoresist 46 is formed on the silicon oxide film 44. Thereafter, by use of the heretofore known photolithography technique, openings are formed in the photoresist 46 on regions where P type diffusion layers 26 and 27 are to be respectively formed. Subsequently, ions of a P type impurity, for example, boron (B) are implanted from the surface of the epitaxial layer 3 at an accelerating voltage of 30 to 200 (keV) and a dose of $1.0 \times 10^{16}$ to $1.0 \times 10^{18}$ (/cm$^2$). After the photoresist 46 is removed and the P type diffusion layers 26 and 27 are formed by thermal diffusion, the silicon oxide film 44 is removed. Note that an impurity concentration of the P type diffusion layers 26 and 27 is controlled so as to cause the junction breakdown voltage of the PN junction regions 34 and 35 (see FIG. 1) to be lower than that of the PN junction regions 32 and 33 (see FIG. 1).

Figure 8:
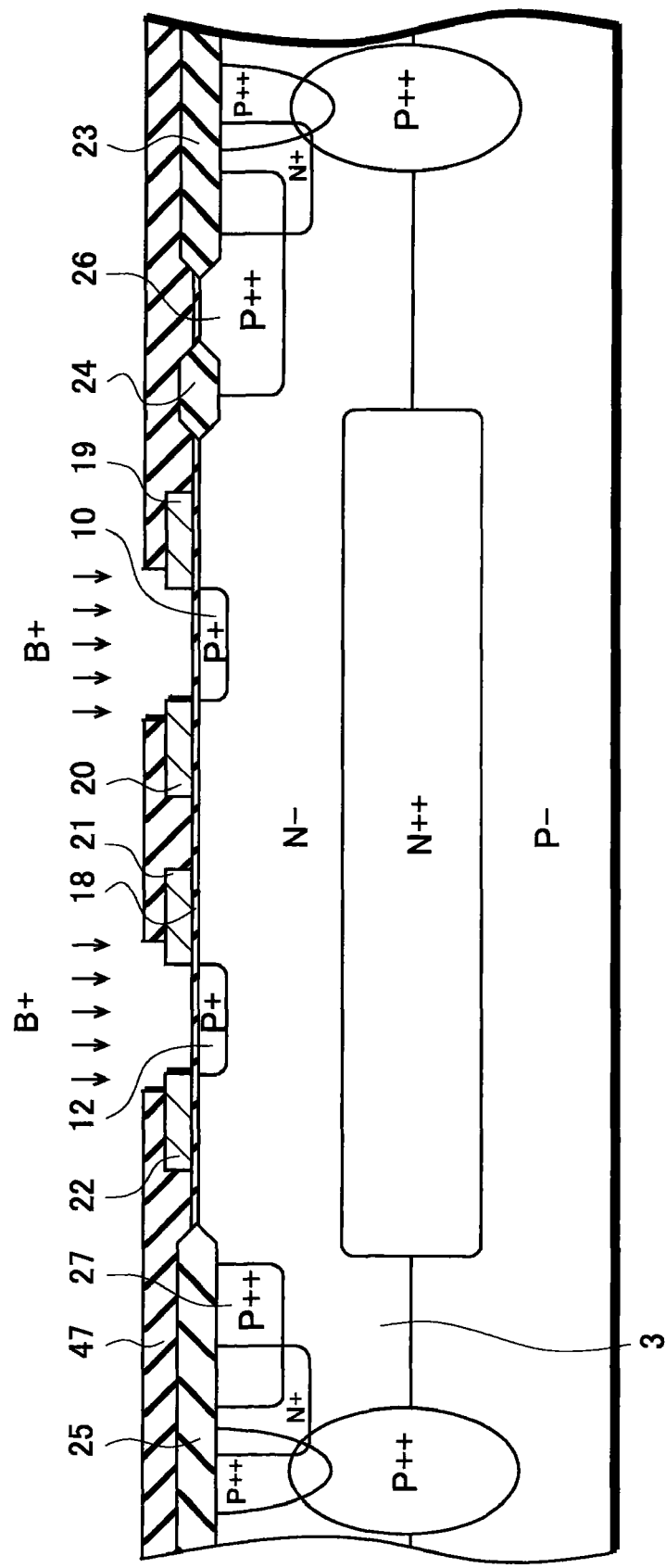
FIG. 8 is a fifth cross-sectional view showing the method of manufacturing a semiconductor device according to the first embodiment of the present invention.

Next, as shown in FIG. 8, LOCOS oxide films 23 to 25 are formed in desired regions of the epitaxial layer 3. Thereafter, a silicon oxide film, a polysilicon film and a tungsten silicon film are deposited on the surface of the epitaxial layer 3. By use of the heretofore known photolithography technique, the silicon oxide film, the polysilicon film and the tungsten silicon film are selectively removed to form a gate oxide film 18 and gate electrodes 19 to 22. Thereafter, a photoresist 47 is formed on the silicon oxide film used as the gate oxide film 18. By use of the heretofore known photolithography technique, openings are formed in the photoresist 47 on regions where P type diffusion layers 10 and 12 are to be respectively formed. Subsequently, ions of a P type impurity, for example, boron (B) are implanted from the surface of the epitaxial layer 3 at an accelerating voltage of 30 to 200 (keV) and a dose of $1.0 \times 10^{14}$ to $1.0 \times 10^{16}$ (/cm$^2$). Thereafter, the photoresist 47 is removed, and the P type diffusion layers 10 and 12 are formed by thermal diffusion.

Figure 9:
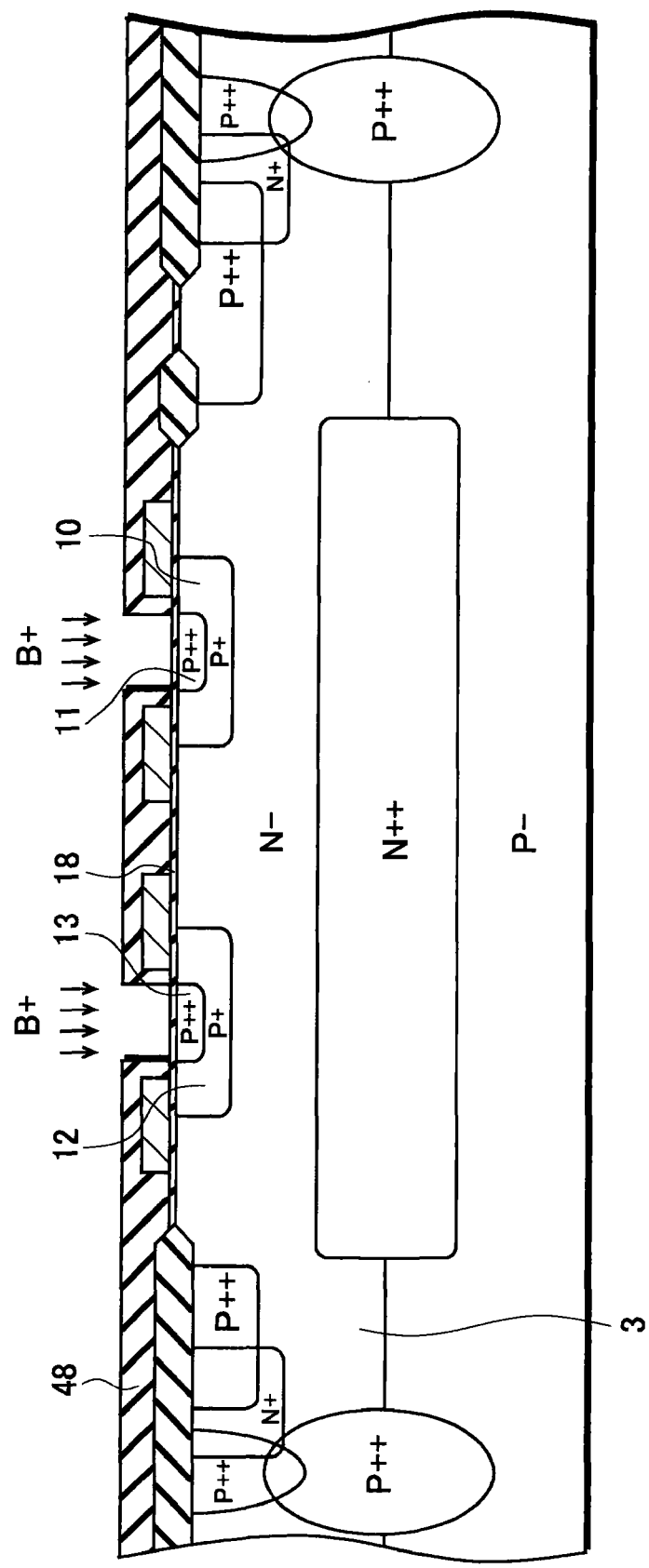
FIG. 9 is a sixth cross-sectional view showing the method of manufacturing a semiconductor device according to the first embodiment of the present invention.

Next, as shown in FIG. 9, a photoresist 48 is formed on the silicon oxide film used as the gate oxide film 18. By use of the heretofore known photolithography technique, openings are formed in the photoresist 48 on regions where P type diffusion layers 11 and 13 are to be respectively formed. Subsequently, ions of a P type impurity, for example, boron (B) are implanted from the surface of the epitaxial layer 3 at an accelerating voltage of 30 to 200 (keV) and a dose of $1.0 \times 10^{16}$ to $1.0 \times 10^{18}$ (/cm$^2$). Thereafter, the photoresist 48 is removed, and the P type diffusion layers 11 and 13 are formed by thermal diffusion.

Figure 10:
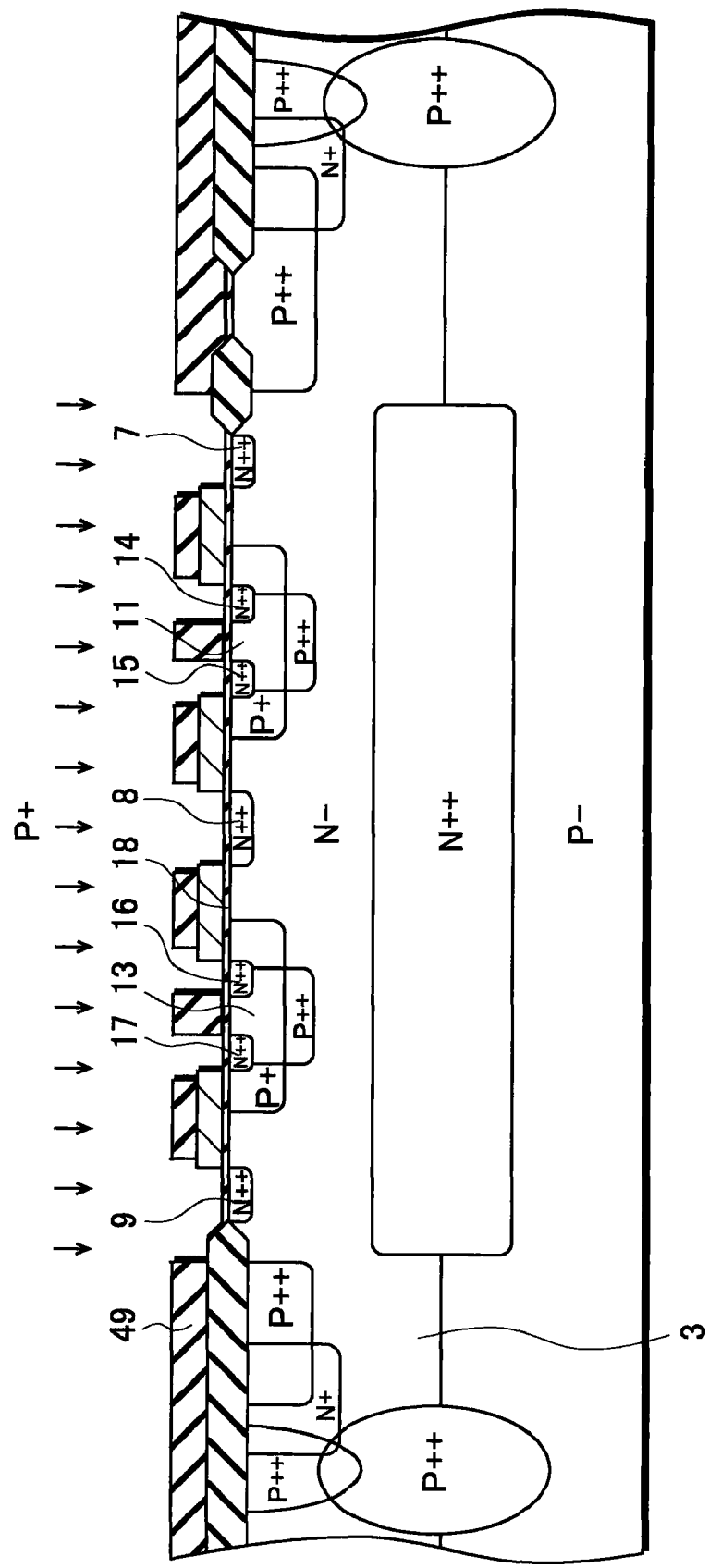
FIG. 10 is a seventh cross-sectional view showing the method of manufacturing a semiconductor device according to the first embodiment of the present invention.

Next, as shown in FIG. 10, a photoresist 49 is formed on the silicon oxide film used as the gate oxide film 18. By use of the heretofore known photolithography technique, openings are formed in the photoresist 49 on regions where N type diffusion layers 7 to 9 and 14 to 17 are to be respectively formed. Subsequently, ions of an N type impurity, for example, phosphorus (P) are implanted from the surface of the epitaxial layer 3 at an accelerating voltage of 70 to 190 (keV) and a dose of $1.0 \times 10^{14}$ to $1.0 \times 10^{16}$ (/cm$^2$). Thereafter, the photoresist 49 is removed, and the N type diffusion layers 7 to 9 and 14 to 17 are formed by thermal diffusion.

Figure 11:
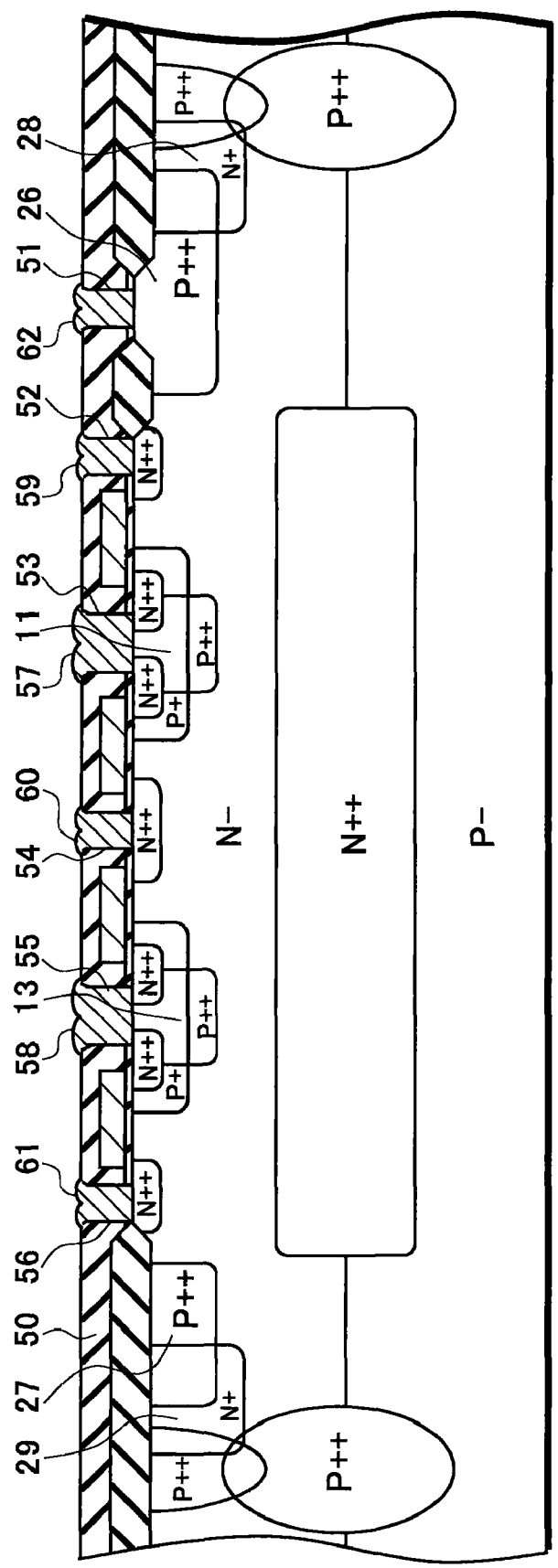
FIG. 11 is a eighth cross-sectional view showing the method of manufacturing a semiconductor device according to the first embodiment of the present invention.

Next, as shown in FIG. 11, as an insulating layer 50, for example, a BPSG (Boron Phospho Silicate Glass) film, a SOG (Spin On Glass) film or the like is deposited on the epitaxial layer 3. Thereafter, by use of the heretofore known photolithography technique, contact holes 51 to 56 are formed in the insulating layer 50 by dry etching using, for example, CHF$_3$ or CF$_4$ gas. In the contact holes 51 to 56, aluminum alloy films made of, for example, an Al—Si film, an Al—Si—Cu film, an Al—Cu film and the like are selectively formed. Thereby, source electrodes 57 and 58, drain electrodes 59 to 61 and an electrode 62 connected to the P type diffusion layer 26 are formed.

Note that, in this embodiment, description was given of the case where the P type diffusion layers 11 and 13 and the P type diffusion layers 26 and 27 are formed in separate steps. However, the embodiment of the present invention is not limited to this case. For example, the P type diffusion layers 11, 13, 26 and 27 may be formed in the same process. In this case, the P type diffusion layers 11, 13, 26 and 27 are diffusion layers formed under the same conditions, and have substantially the same impurity concentration. As a result, by controlling conditions for forming the N type diffusion layers 28 and 29, for example, the impurity concentration thereof, the junction breakdown voltage of the PN junction regions 34 and 35 is caused to be lower than that of the PN junction regions 32 and 33. In other words, the junction breakdown voltage is determined by the conditions for forming the N type diffusion layers 28 and 29. Accordingly, control of the junction breakdown voltage is facilitated. Besides the above, various modifications can be made without departing from the scope of the embodiment of the present invention.

Figure 3:
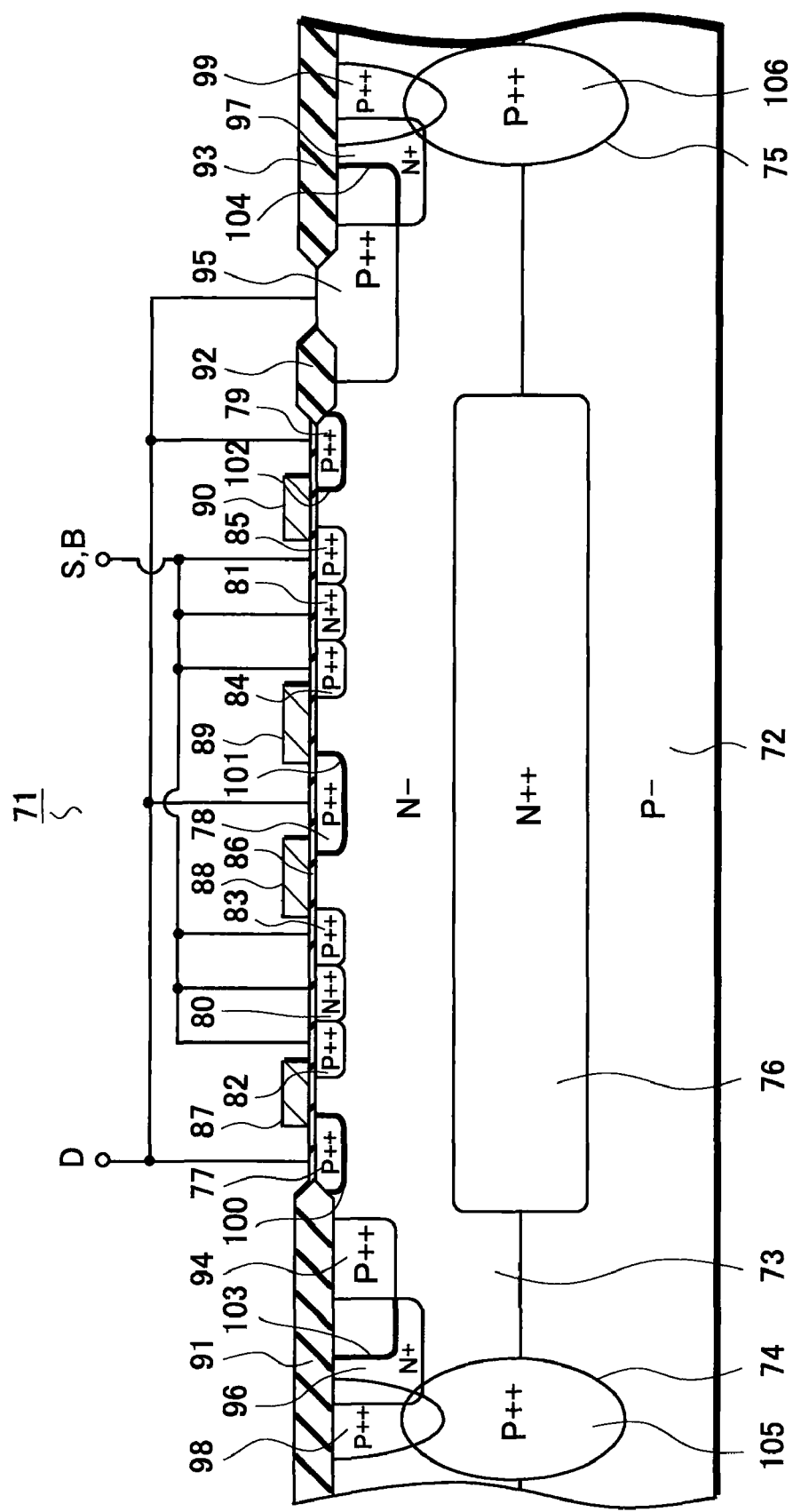
FIG. 3 is a cross-sectional view showing a semiconductor device according to a second embodiment of the present invention.

Next, with reference to FIG. 3, a semiconductor device according to a second embodiment of the present invention will be described in detail. FIG. 3 is a cross-sectional view for explaining the semiconductor device according to this embodiment.

As shown in FIG. 3, a P-channel MOS transistor 71 mainly includes a P type single crystal silicon substrate 72, an N type epitaxial layer 73, isolation regions 74 and 75, an N type buried diffusion layer 76, P type diffusion layers 77 to 79 used as drain regions, N type diffusion layers 80 and 81 used as back gate regions, P type diffusion layers 82 to 85 used as source regions, a gate oxide film 86, and gate electrodes 87 to 90.

The N type epitaxial layer 73 is formed on the P type single crystal silicon substrate 72. Note that, although one epitaxial layer 73 is formed on the substrate 72 in this embodiment, the present invention is not limited to this case. For example, the substrate is stacked with a plurality of epitaxial layers.

Each of the isolation regions 74 and 75 is formed so as to extend in the substrate 72 and the epitaxial layer 73. The epitaxial layer 73 is divided into a plurality of element formation regions by the isolation regions 74 and 75. For example, the isolation regions 74 and 75 are circularly formed so as to surround a formation region of the MOS transistor 71.

The N type buried diffusion layer 76 is formed so as to extend in both regions of the substrate 72 and the epitaxial layer 73. As shown in FIG. 3, the N type buried diffusion layer 76 is formed across the formation region of the MOS transistor 71 defined by the isolation regions 74 and 75.

The P type diffusion layers 77 to 79 are formed in the epitaxial layer 73. The P type diffusion layers 77 to 79 are used as the drain regions. Note that the P type diffusion layers 77 and 79 may be circularly formed around the P type diffusion layer 78.

The N type diffusion layers 80 and 81 are formed in the epitaxial layer 73. The N type diffusion layers 80 and 81 are used as the back gate lead-out regions. Note that the N type diffusion layers 80 and 81 may be circularly formed around the P type diffusion layer 78.

The P type diffusion layers 82 to 85 are formed in the epitaxial layer 73. The P type diffusion layers 82 to 85 are used as the source regions. As shown in FIG. 3, the P type diffusion layers 82 and 83 are wired so as to have the same potential as that of the N type diffusion layer 80. Moreover, the P type diffusion layers 84 and 85 are wired so as to have the same potential as that of the N type diffusion layer 81. Note that the P type diffusion layers 82 and 85 may be circularly formed around the P type diffusion layer 78. Moreover, the P type diffusion layers 83 and 84 may be circularly formed around the P type diffusion layer 78.

The gate oxide film 86 is formed on the epitaxial layer 73.

The gate electrodes 87 to 90 are formed on the gate oxide film 86. Each of the gate electrodes 87 to 90 is formed of, for example, a polysilicon film, a tungsten silicide film or the like so as to have a desired thickness. The N type epitaxial layer 73 positioned below the gate electrodes 87 to 90 is used as a channel region. Note that the gate electrodes 87 and 90 may be circularly formed. Moreover, the gate electrodes 88 and 89 may be circularly formed.

LOCOS (Local Oxidation of Silicon) oxide films 91 to 93 are formed in the epitaxial layer 73. Each of the LOCOS oxide films 91 to 93 has a thickness of, for example, about 3000 to 10000 Å in its flat portion.

P type diffusion layers 94 and 95 are formed in the epitaxial layer 73. The P type diffusion layers 94 and 95 are disposed around the formation region of the MOS transistor 71 in the region defined by the isolation regions 74 and 75. Moreover, as shown in FIG. 3, the P type diffusion layers 94 and 95 are wired so as to have the same potential as a drain potential of the MOS transistor 71. Note that the P type diffusion layers 94 and 95 may be circularly disposed around the formation region of the MOS transistor 71, and along an arrangement of the isolation regions 74 and 75.

N type diffusion layers 96 and 97 are formed in the epitaxial layer 73. The N type diffusion layers 96 and 97 are formed so as to at least partially overlap the P type diffusion layers 94 and 95, respectively. Furthermore, the N type diffusion layers 96 and 97 are formed so as to at least partially overlap P type diffusion layers 98 and 99 included in the isolation regions 74 and 75, respectively. Moreover, although the N type diffusion layers 96 and 97 are not connected directly to a wiring layer (not shown) on the epitaxial layer 73, a back gate potential is substantially applied thereto through the epitaxial layer 73. Note that the N type diffusion layers 96 and 97 may be circularly disposed around the formation region of the MOS transistor 71, and along the arrangement of the isolation regions 74 and 75.

Next, as indicated by thick solid lines, PN junction regions 100 to 102 are formed between the P type diffusion layers 77 to 79 used as the drain regions of the MOS transistor 71 and the N type epitaxial layer 73 used as the back gate region. The drain potential is applied to the P type diffusion layers 77 to 79. Meanwhile, the back gate potential is applied to the N type epitaxial layer 73 through the N type diffusion layers 80 and 81. For example, in the MOS transistor 71, the drain potential is a ground potential and a source potential is a power supply potential. That is, a reverse bias is applied to the PN junction regions 100 to 102 of the MOS transistor 71.

Moreover, as indicated by thick solid lines, around the formation region of the MOS transistor 71, a PN junction region 103 is formed between the P type diffusion layer 94 and the N type diffusion layer 96, and also a PN junction region 104 is formed between the P type diffusion layer 95 and the N type diffusion layer 97. As described above, the drain potential is applied to the P type diffusion layers 94 and 95 through the wiring layer on the epitaxial layer 73. Meanwhile, the back gate potential is substantially applied to the N type diffusion layers 96 and 97 through the epitaxial layer 73. In other words, substantially the same reverse bias as that applied to the PN junction regions 100 to 102 is applied to the PN junction regions 103 and 104.

Here, the PN junction regions 103 and 104 are formed so as to have a junction breakdown voltage lower than that of the PN junction regions 100 to 102. To be more specific, formation of the N type diffusion layers 96 and 97 in the N type epitaxial layer 73 increases the impurity concentration on the N type region side in the PN junction regions 103 and 104. Accordingly, by controlling the impurity concentration of the N type diffusion layers 96 and 97, the junction breakdown voltage of the PN junction regions 103 and 104 is caused to be lower than that of the PN junction regions 100 to 102. Moreover, the junction breakdown voltage of the PN junction regions 103 and 104 similarly is caused to be lower than that of the PN junction regions 100 to 102 by controlling the impurity concentration of the P type diffusion layers 77 to 79 and the impurity concentration of the P type diffusion layers 94 and 95. Note that the PN junction regions 103 and 104 have the junction breakdown voltage that can resist a source-drain voltage applied when the MOS transistor 71 operates.

By use of the structure described above, for example, when an overvoltage, for example, negative ESD surge is applied to a pad for a drain electrode in the MOS transistor 71, the PN junction regions 103 and 104 break down before the PN junction regions 100 to 102 break down. Accordingly, a breakdown current flows through the PN junction regions 103 and 104 to prevent breakdown of the PN junction regions 100 to 102. Thereby, the MOS transistor 71 can be protected from the ESD surge. Specifically, protection elements having the PN junction regions 103 and 104 are operated against the ESD surge, and thereby the MOS transistor 71 can be protected.

Furthermore, in the protection elements having the PN junction regions 103 and 104, the PN junction regions 103 and 104 are formed across wide regions by disposing the P type diffusion layers 94 and 95 and the N type diffusion layers 96 and 97, and along the arrangement of the isolation regions 74 and 75. By use of this structure, concentration of the breakdown current in the PN junction regions 103 and 104 can be prevented. Thus, it is possible to suppress breakdown of the protection elements having the PN junction regions 103 and 104.

Furthermore, the protection elements having the PN junction regions 103 and 104 are formed by utilizing the isolation regions 74 and 75 within the element formation region defined by the isolation regions 74 and 75. By use of this structure, the junction breakdown voltage of the protection element can be determined according to each of semiconductor elements formed in the element formation region defined by the isolation regions. That is, protection elements suitable for the respective semiconductor elements can be individually disposed, and thereby each of the semiconductor elements can be protected from the ESD surge and the like. For example, even when an ESD surge protection element is disposed around the pad for the drain electrode, the semiconductor elements can be more surely protected by further forming the above-described protection elements in formation regions of the respective semiconductor elements. Moreover, an actual operation region of a chip can be effectively utilized by including the protection elements in each of the element formation regions by using the isolation regions.

Next, also in the P-channel MOS transistor 71 shown in FIG. 3, each of the protection elements having the PN junction regions 103 and 104 operates as a bipolar transistor, as in the case of the N-channel MOS transistor 1 described with reference to FIGS. 1 and 2. The P-channel MOS transistor 71 is a PNP transistor in which the P type diffusion layers 94 and 95 are emitter regions, the N type diffusion layers 96 and 97 are base regions, and the P type diffusion layers 98, 99, 105 and 106 are collector regions.

For example, considered is the case where negative ESD surge is applied to the pad for the drain electrode in the MOS transistor 71. When the PN junction regions 103 and 104 break down, a current flows between the base and the emitter of the PNP transistor, and the PNP transistor is turned on. When the PNP transistor is turned on, a breakdown current flows into the substrate 72. Specifically, when each of the protection elements having the PN junction regions 103 and 104 operates as a bipolar transistor, the breakdown current flows into the substrate 72 and disperses therein.

As described above with reference to FIGS. 1 and 2, when the breakdown current flows between the base and the emitter of the PNP transistor, the PNP transistor is turned on. In this event, when the PNP transistor is turned on, the conductivity of the P type diffusion layers 98, 99, 105 and 106 used as the collector regions is modulated. Accordingly, the resistance value thereof is significantly reduced, and the current capacity thereof is improved. Specifically, when each of the protection elements having the PN junction regions 103 and 104 operates as the bipolar transistor, capacity of the breakdown current flowing into the substrate 72 is improved.

Moreover, as described above with reference to FIGS. 1 and 2, when the breakdown current flows through the isolation regions 74 and 75, potentials respectively of the substrate 72 and the isolation regions 74 and 75 are changed. By operating each of the protection elements as the bipolar transistor, a range of potential changes in the substrate 72 and the isolation regions 74 and 75 can be decreased. Accordingly, malfunction of semiconductor elements formed in other element formation regions due to the potential change in the substrate 72 can be prevented.

Meanwhile, for example, when positive ESD surge is applied to the pad for the drain electrode in the MOS transistor 71, a forward bias is applied to the PN junction regions 100 to 102 and the PN junction regions 103 and 104. In this case, as described above, each of the PN junction regions 103 and 104 becomes a region having low resistance by the N type diffusion layers 96 and 97. Moreover, by disposing the P type diffusion layers 94 and 95 and the N type diffusion layers 96 and 97 along the isolation regions 74 and 75, the width of a current path is increased. Accordingly, each of the PN junction regions 103 and 104 becomes a region having much lower resistance. By use of this structure, a current generated by application of the positive ESD surge flows into the substrate 72 mainly through the PN junction regions 103 and 104. Also in this event, when each of the protection elements having the PN junction regions 103 and 104 operates as the bipolar transistor, capacity of the current flowing into the substrate 72 is improved. Moreover, the MOS transistor 71 is protected by preventing breakdown of the PN junction regions 100 to 102 due to concentration of the current generated by application of the positive ESD surge.

Next, with reference to FIGS. 12 to 18, detailed description will be given of a method of manufacturing a semiconductor device according to the second embodiment of the present invention. FIGS. 12 to 18 are cross-sectional views showing the method of manufacturing a semiconductor device according to this embodiment. Note that FIGS. 12 to 18 show a method of manufacturing the semiconductor device shown in FIG. 3.

Figure 12:
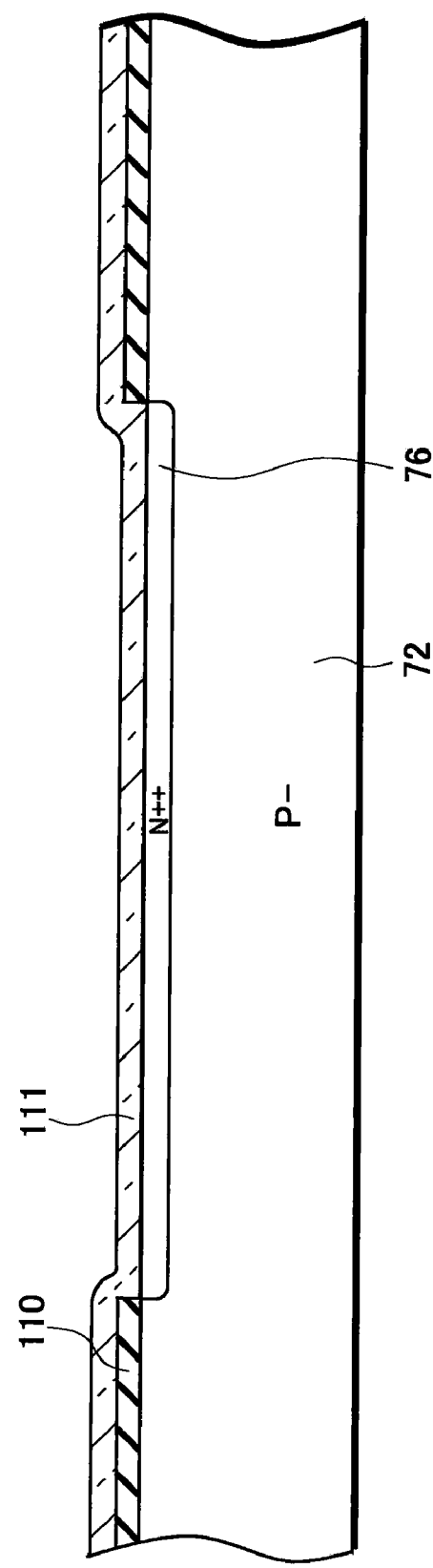
FIG. 12 is a first cross-sectional view showing the method of manufacturing a semiconductor device according to a second embodiment of the present invention.

First, as shown in FIG. 12, a P type single crystal silicon substrate 72 is prepared. A silicon oxide film 110 is formed on the substrate 72, and the silicon oxide film 110 is selectively removed so as to form an opening in a formation region for an N type buried diffusion layer 76. Thereafter, by using the silicon oxide film 110 as a mask, a liquid source 111 containing an N type impurity, for example, antimony (Sb) is applied onto a surface of the substrate 72 by use of a spin-coating method. Subsequently, after antimony (Sb) is thermally diffused to form the N type buried diffusion layer 76, the silicon oxide film 110 and the liquid source 111 are removed.

Figure 13:
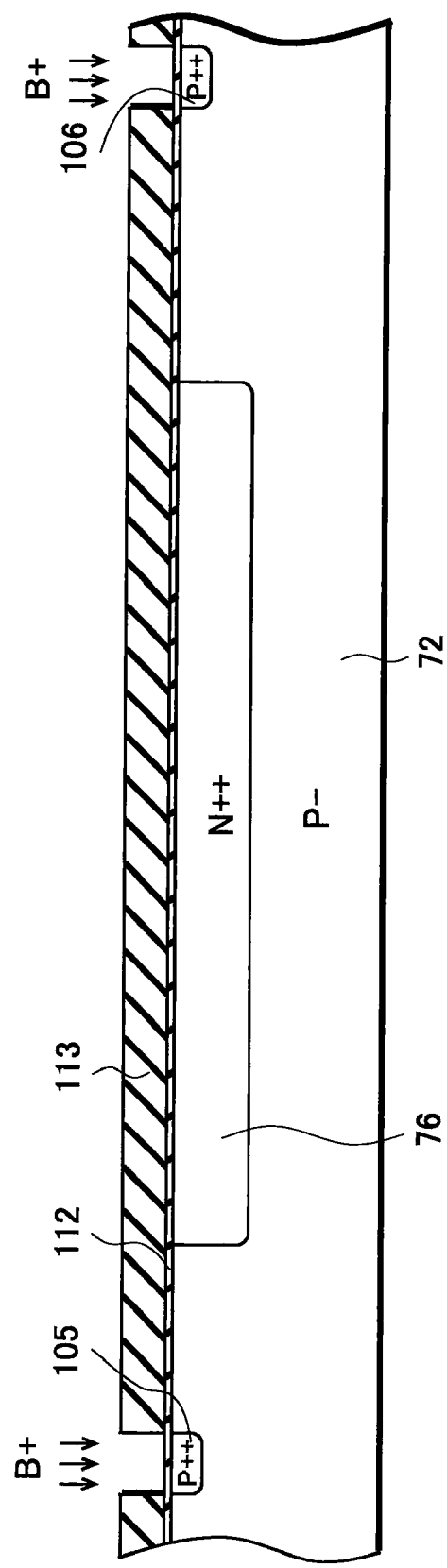
FIG. 13 is a second cross-sectional view showing the method of manufacturing a semiconductor device according to the second embodiment of the present invention.

Next, as shown in FIG. 13, a silicon oxide film 112 is formed on the substrate 72 and a photoresist 113 is formed on the silicon oxide film 112. Thereafter, by use of a heretofore known photolithography technique, openings are formed in the photoresist 113 on regions where P type buried diffusion layers 105 and 106 are to be respectively formed. Subsequently, ions of a P type impurity, for example, boron (B) are implanted from the surface of the substrate 72 at an accelerating voltage of 40 to 180 (keV) and a dose of $1.0 \times 10^{13}$ to $1.0 \times 10^{16}$ (/cm$^2$). After the photoresist 113 is removed and the P type buried diffusion layers 105 and 106 are formed by thermal diffusion, the silicon oxide film 112 is removed.

Figure 14:
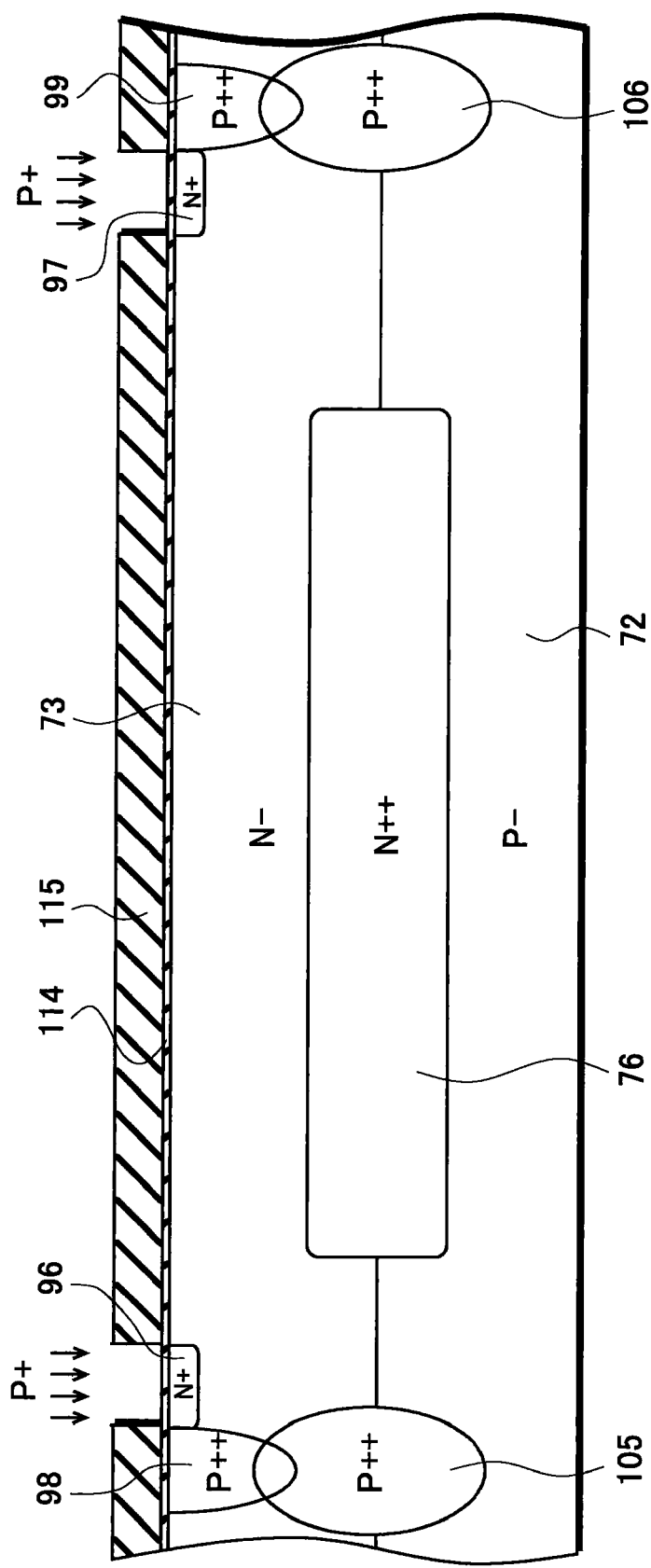
FIG. 14 is a third cross-sectional view showing the method of manufacturing a semiconductor device according to the second embodiment of the present invention.

Next, as shown in FIG. 14, the substrate 72 is placed on a susceptor of a vapor phase epitaxial growth apparatus, and an N type epitaxial layer 73 is formed on the substrate 72. The vapor phase epitaxial growth apparatus mainly includes a gas supply system, a reactor, an exhaust system and a control system. In this embodiment, by use of a vertical reactor, thickness uniformity of the epitaxial layer can be improved. The N type buried diffusion layer 76 and the P type buried diffusion layers 105 and 106 are thermally diffused by heat treatment in the step of forming the epitaxial layer 73.

Next, by use of the heretofore known photolithography technique, P type diffusion layers 98 and 99 are formed in the epitaxial layer 73. Thereafter, a silicon oxide film 114 is formed on the epitaxial layer 73, and a photoresist 115 is formed on the silicon oxide film 114. Subsequently, by use of the heretofore known photolithography technique, openings are formed in the photoresist 115 on regions where N type diffusion layers 96 and 97 are to be respectively formed. Thereafter, ions of an N type impurity, for example, phosphorus (P) are implanted from the surface of the epitaxial layer 73 at an accelerating voltage of 40 to 180 (keV) and a dose of $1.0 \times 10^{13}$ to $1.0 \times 10^{16}$ (/cm$^2$). Subsequently, the photoresist 115 is removed, and the N type diffusion layers 96 and 97 are formed by thermal diffusion. Note that an impurity concentration of the N type diffusion layers 96 and 97 is controlled so as to cause a junction breakdown voltage of PN junction regions 103 and 104 (see FIG. 3) to be lower than that of PN junction regions 100 to 102 (see FIG. 3).

Figure 15:
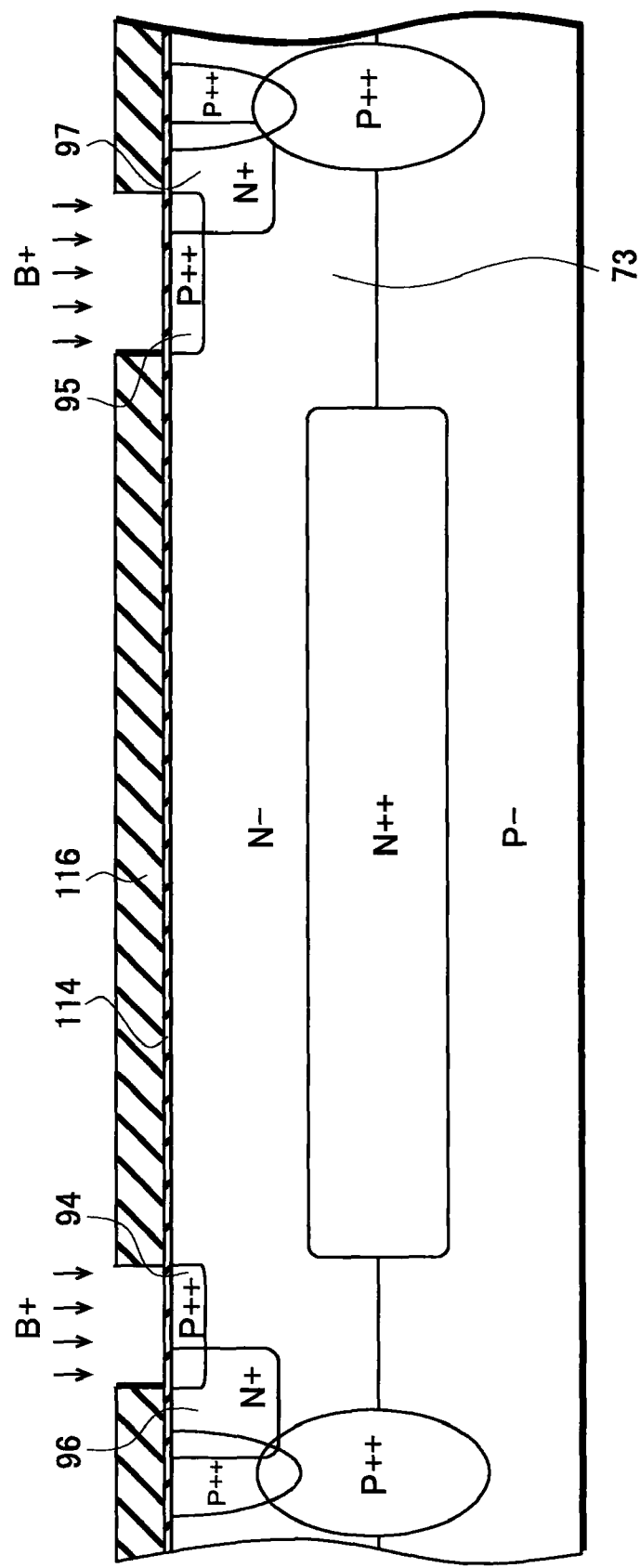
FIG. 15 is a fourth cross-sectional view showing the method of manufacturing a semiconductor device according to the second embodiment of the present invention.

Next, as shown in FIG. 15, a photoresist 116 is formed on the silicon oxide film 114. Thereafter, by use of the heretofore known photolithography technique, openings are formed in the photoresist 116 on regions where P type diffusion layers 94 and 95 are to be respectively formed. Subsequently, ions of a P type impurity, for example, boron (B) are implanted from the surface of the epitaxial layer 73 at an accelerating voltage of 30 to 200 (keV) and a dose of $1.0 \times 10^{16}$ to $1.0 \times 10^{18}$ (/cm$^2$). After the photoresist 116 is removed and the P type diffusion layers 94 and 95 are formed by thermal diffusion, the silicon oxide film 114 is removed. Note that an impurity concentration of the P type diffusion layers 94 and 95 is controlled so as to cause the junction breakdown voltage of the PN junction regions 103 and 104 (see FIG. 3) to be lower than that of the PN junction regions 100 to 102 (see FIG. 3).

Figure 16:
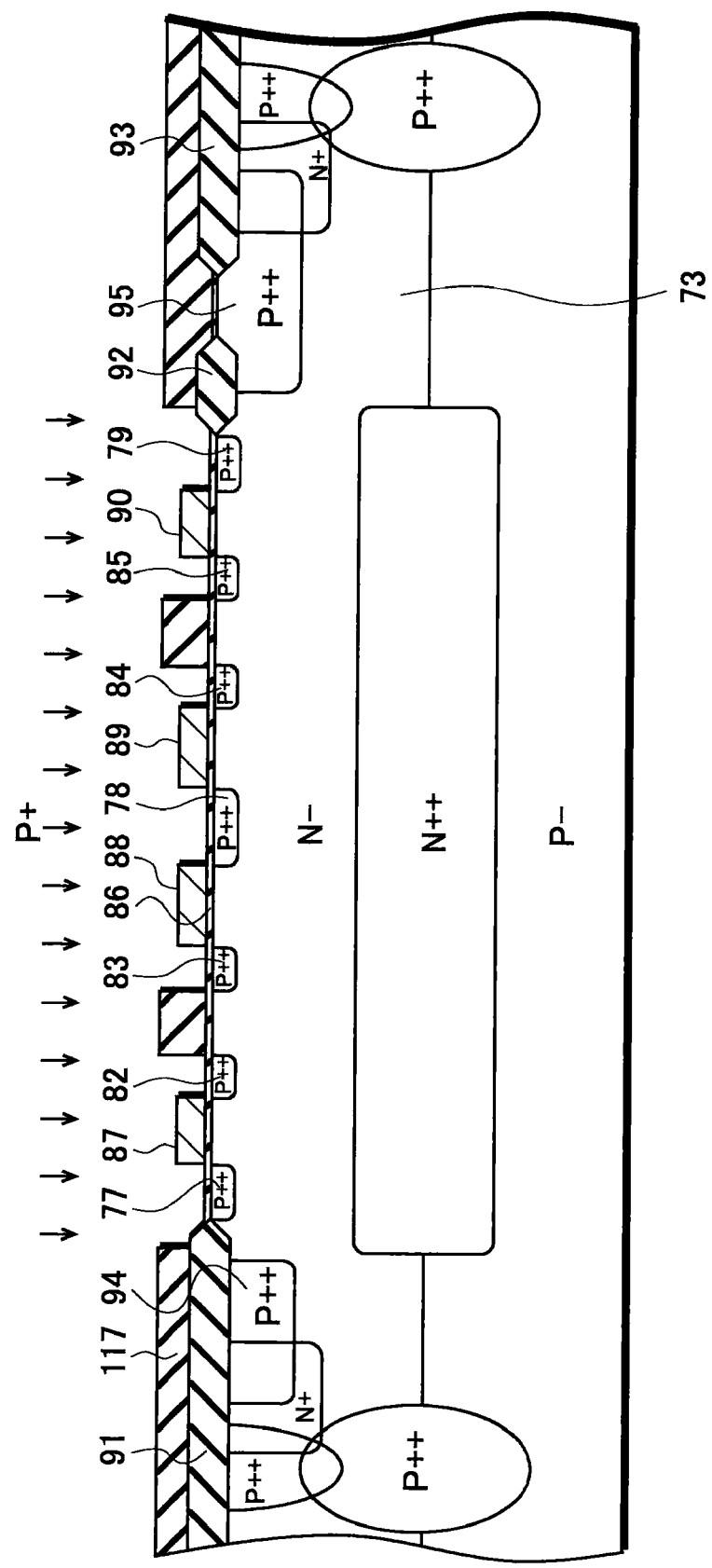
FIG. 16 is a fifth cross-sectional view showing the method of manufacturing a semiconductor device according to the second embodiment of the present invention.

Next, as shown in FIG. 16, LOCOS oxide films 91 to 93 are formed respectively in desired regions of the epitaxial layer 73. Thereafter, a silicon oxide film, a polysilicon film and a tungsten silicon film are deposited on the surface of the epitaxial layer 73. By use of the heretofore known photolithography technique, the polysilicon film and the tungsten silicon film are selectively removed to form a gate oxide film 86 and gate electrodes 87 to 90. Thereafter, a photoresist 117 is formed on the silicon oxide film to be used as the gate oxide film 86. By use of the heretofore known photolithography technique, openings are formed in the photoresist 117 on regions where P type diffusion layers 77 to 79 and 82 to 85 are to be respectively formed. Subsequently, ions of a P type impurity, for example, boron (B) are implanted from the surface of the epitaxial layer 73 at an accelerating voltage of 30 to 200 (keV) and a dose of $1.0 \times 10^{16}$ to $1.0 \times 10^{18}$ (/cm$^2$). Thereafter, the photoresist 117 is removed, and the P type diffusion layers 77 to 79 and 82 to 85 are formed by thermal diffusion.

Figure 17:
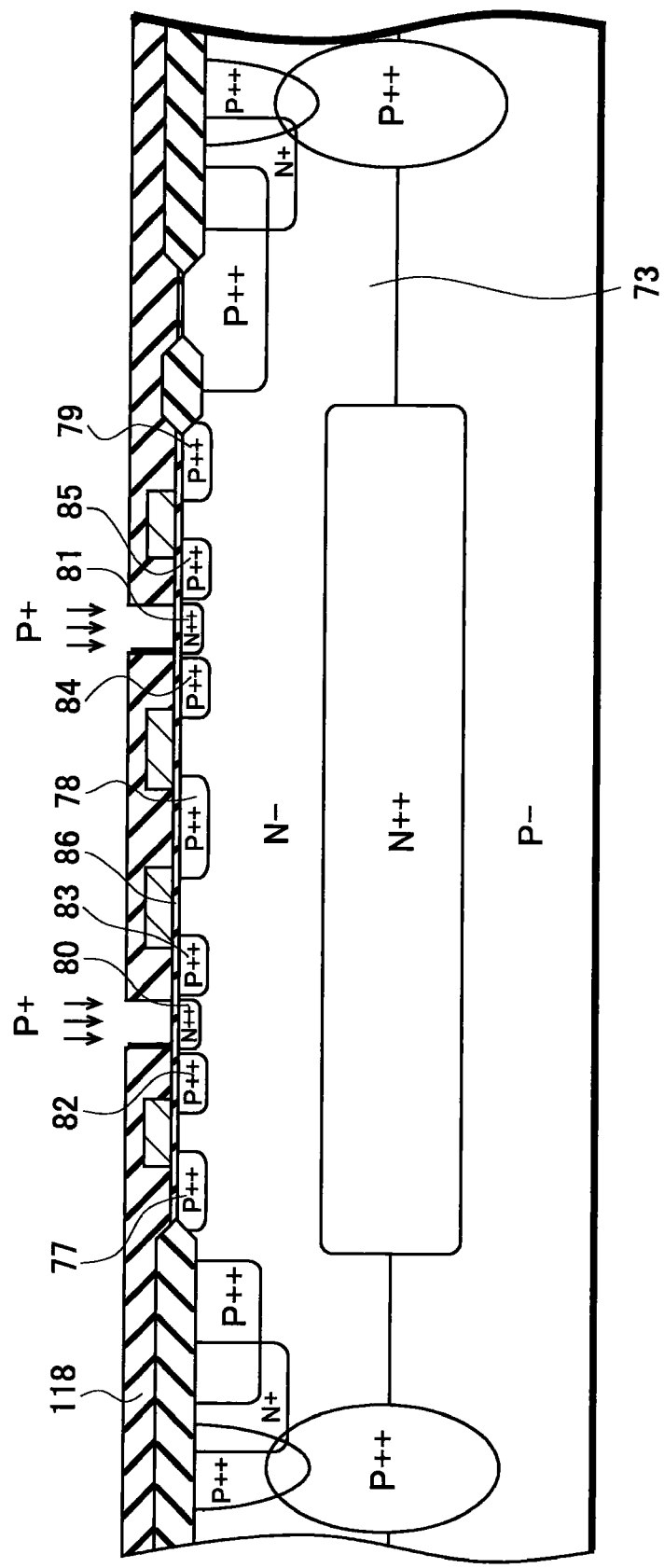
FIG. 17 is a sixth cross-sectional view showing the method of manufacturing a semiconductor device according to the second embodiment of the present invention.

Next, as shown in FIG. 17, a photoresist 118 is formed on the silicon oxide film to be used as the gate oxide film 86. By use of the heretofore known photolithography technique, openings are formed in the photoresist 118 on regions where N type diffusion layers 80 and 81 are to be respectively formed. Subsequently, ions of an N type impurity, for example, phosphorus (P) are implanted from the surface of the epitaxial layer 73 at an accelerating voltage of 70 to 190 (keV) and a dose of $1.0 \times 10^{14}$ to $1.0 \times 10^{16}$ (/cm$^2$). Thereafter, the photoresist 118 is removed, and the N type diffusion layers 80 and 81 are formed by thermal diffusion.

Figure 18:
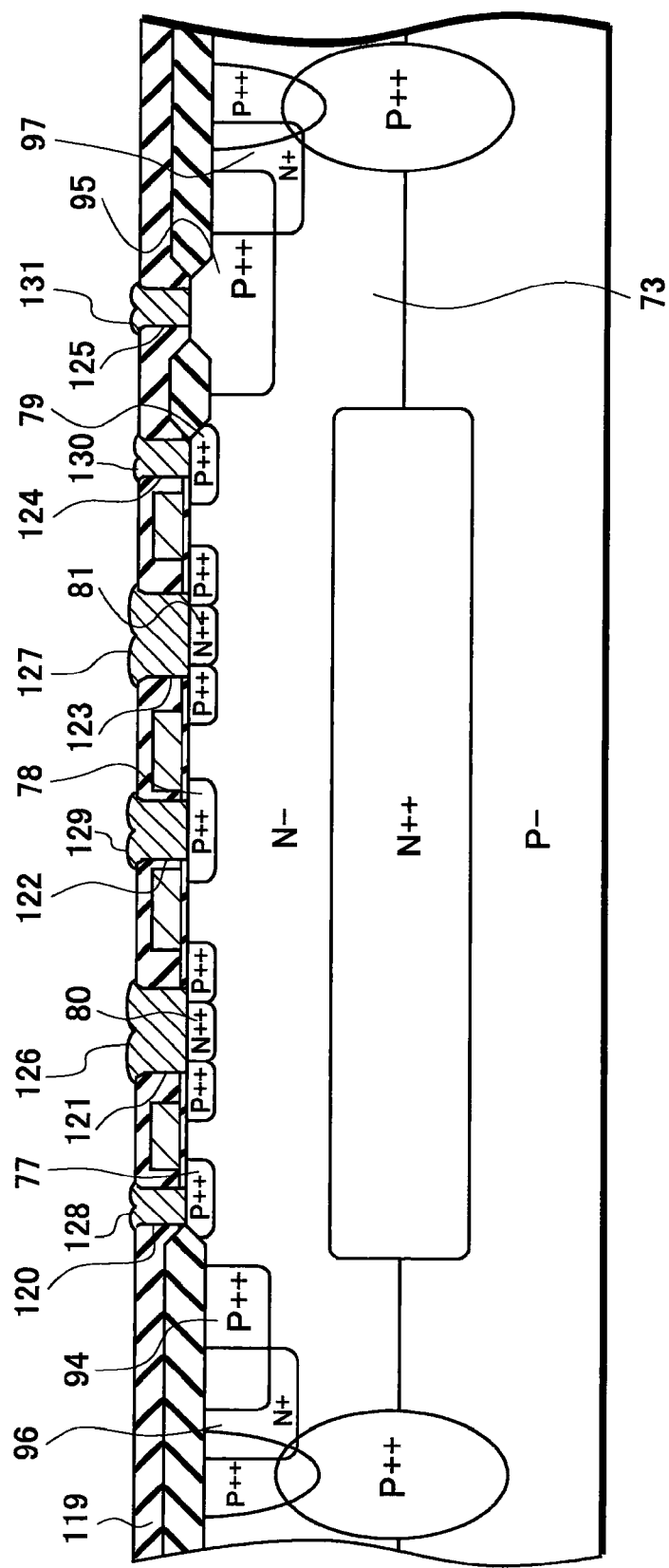
FIG. 18 is a seventh cross-sectional view showing the method of manufacturing a semiconductor device according to the second embodiment of the present invention.

Next, as shown in FIG. 18, as an insulating layer 119, for example, a BPSG (Boron Phospho Silicate Glass) film, a SOG (Spin On Glass) film or the like is deposited on the epitaxial layer 73. Thereafter, by use of the heretofore known photolithography technique, contact holes 120 to 125 are formed in the insulating layer 119 by dry etching using, for example, CHF$_3$ or CF$_4$ gas. In the contact holes 120 to 125, aluminum alloy films made of, for example, an Al—Si film, an Al—Si—Cu film, an Al—Cu film and the like are selectively formed. Accordingly, source electrodes 126 and 127, drain electrodes 128 to 130 and an electrode 131 to be connected to the P type diffusion layer 95 are formed.

Note that, in this embodiment, description has been given of the case where the P type diffusion layers 94 and 95 and the P type diffusion layers 77 to 79 are formed in separate steps. However, the embodiment of the present invention is not limited to this case. For example, the P type diffusion layers 77 to 79, 94 and 95 may be formed in the same process. In this case, the P type diffusion layers 77 to 79, 94 and 95 are diffusion layers formed under the same conditions and to have the same impurity concentration. As a result, by controlling conditions for forming the N type diffusion layers 96 and 97, for example, the impurity concentration thereof, the junction breakdown voltage of the PN junction regions 103 and 104 is caused to be lower than that of the PN junction regions 100 to 102. In other words, the junction breakdown voltage is determined by the conditions for forming the N type diffusion layers 96 and 97. Accordingly, control of the junction breakdown voltage is facilitated. Besides the above, various modifications can be made without departing from the scope of the embodiment of the present invention.

In the embodiment of the present invention, the protection element having the junction region which breaks down before the junction region of the MOS transistor is formed around the MOS transistor. This structure can protect the MOS transistor from the overvoltage.

Moreover, in the embodiment of the present invention, the protection element formed around the MOS transistor operates as a bipolar transistor. With this structure, capability of discharging the current generated by the overvoltage is improved.

Moreover, in the embodiment of the present invention, the protection element having the junction region which breaks down before the junction region of the MOS transistor is connected to the substrate through the isolation region. This structure makes it possible to cause the current, which is generated by the overvoltage, to flow into the substrate, and thereby to disperse the current in the substrate.

Moreover, in the embodiment of the present invention, the protection element having the junction region which breaks down before the junction region of the MOS transistor is formed by utilizing the isolation region. By use of this structure, a protection element suitable for an individual semiconductor element is formed in each element formation region.

What is claimed is:

1. A semiconductor device comprising:
   a semiconductor layer;
   an isolation region dividing the semiconductor layer into a plurality of regions;
   a MOS transistor in one of the plurality of regions divided by the isolation region;
   a first p-n junction region between the semiconductor layer and a diffusion layer included in the MOS transistor; and
   a protection element, which is disposed around a formation region of the MOS transistor, and which has a second p-n junction region having a junction breakdown voltage lower than that of the first p-n junction region,
   wherein the protection element includes part of the isolation region surrounding the formation region of the MOS transistor.

2. The semiconductor device according to claim 1, wherein the semiconductor layer comprises a stack that includes a semiconductor substrate of one conductivity type and at least one epitaxial layer of opposite conductivity type,
   wherein the isolation region, which divides the at least one epitaxial layer, connects to the semiconductor substrate,
   wherein the second p-n junction region is formed of a first diffusion layer of the one conductivity type and a first diffusion layer of the opposite conductivity type,
   wherein the first diffusion layer of the one conductivity type is connected by wiring to the diffusion layer included in the MOS transistor, the diffusion layer included in the MOS transistor being used as a back gate region of the MOS transistor,
   wherein the first diffusion layer of the opposite conductivity type is formed in the at least one epitaxial layer, and
   wherein the first diffusion layer of the opposite conductivity type is disposed so as to overlap a second diffusion layer of the one conductivity type included in the isolation region.

3. The semiconductor device according to claim 1, wherein the first diffusion layer of the one conductivity type and the diffusion layer of the opposite conductivity type are circularly disposed around the formation region of the MOS transistor, and along a formation region of the isolation region.

4. The semiconductor device according to claim 1, wherein the protection element operates as a bipolar transistor.

5. The semiconductor device according to claim 1, wherein the semiconductor layer is formed by stacking a semiconductor substrate of one conductivity type with at least one epitaxial layer of opposite conductivity type,
   the second junction region is formed of a first diffusion layer of the one conductivity type and a diffusion layer of the opposite conductivity type, the first diffusion layer of the one conductivity type connected by wiring to the diffusion layer used as a drain region of the MOS transistor, and the diffusion layer of the opposite conductivity type formed in the epitaxial layer, and the diffusion layer of the opposite conductivity type is disposed so as to overlap a second diffusion layer of the one conductivity type connected to the semiconductor substrate.

6. The semiconductor device according to claim 5, further comprising:

an isolation region which divides the epitaxial layer, wherein the second diffusion layer of the one conductivity type is a diffusion layer included in the isolation region.

7. The semiconductor device according to claim 6, wherein the first diffusion layer of the one conductivity type and the diffusion layer of the opposite conductivity type are circularly disposed around the formation region of the MOS transistor, and along a formation region of the isolation region.

8. The semiconductor device according to claim 5, wherein the protection element operates as a bipolar transistor.

* * * * *